US011233967B2

(12) United States Patent
Hagihara

(10) Patent No.: US 11,233,967 B2
(45) Date of Patent: Jan. 25, 2022

(54) AD CONVERSION CIRCUIT, IMAGING DEVICE, AND ENDOSCOPE SYSTEM

(71) Applicant: OLYMPUS CORPORATION, Hachioji (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/940,748

(22) Filed: Jul. 28, 2020

(65) Prior Publication Data

US 2020/0358975 A1 Nov. 12, 2020

Related U.S. Application Data

(63) Continuation of application No. PCT/JP2018/003379, filed on Feb. 1, 2018.

(51) Int. Cl.
*H04N 5/378* (2011.01)
*G02B 23/24* (2006.01)
*H03M 1/34* (2006.01)
*H03M 1/56* (2006.01)
*H04N 5/3745* (2011.01)

(52) U.S. Cl.
CPC ......... *H04N 5/378* (2013.01); *G02B 23/2469* (2013.01); *G02B 23/2484* (2013.01); *H03M 1/34* (2013.01); *H03M 1/56* (2013.01); *H04N 5/37455* (2013.01); *H04N 5/37457* (2013.01)

(58) Field of Classification Search
None
See application file for complete search history.

(56) References Cited

U.S. PATENT DOCUMENTS

2013/0234004 A1* 9/2013 Hagihara ............... H04N 5/378
250/208.1

FOREIGN PATENT DOCUMENTS

| JP | 2006-340044 A | 12/2006 |
| JP | 2008-92091 A | 4/2008 |
| WO | 2016/084511 A1 | 6/2016 |

OTHER PUBLICATIONS

International Search Report dated Apr. 24, 2018, issued in counterpart International Application No. PCT/JP2018/003379 with English translation (4 pages).

* cited by examiner

*Primary Examiner* — Clifford Hilaire
(74) *Attorney, Agent, or Firm* — Westerman, Hattori, Daniels & Adrian, LLP

(57) ABSTRACT

In an AD conversion circuit, a comparator is configured to compare a first voltage of a first input terminal with a second voltage of a second input terminal. A reset circuit is configured to reset a voltage of the first input terminal of the comparator and a voltage of the second input terminal of the comparator when a second analog signal is input to the first input terminal of the comparator. A first signal generation circuit is configured to generate the second analog signal having a third voltage higher or lower than a voltage of a first analog signal. The first analog signal is input to the first input terminal of the comparator after the voltage of the first input terminal of the comparator and the voltage of the second input terminal of the comparator are reset.

7 Claims, 21 Drawing Sheets

AD CONVERSION CIRCUIT, IMAGING DEVICE, AND ENDOSCOPE SYSTEM

The present application is a continuation application based on International Patent Application No. PCT/JP2018/003379 filed on Feb. 1, 2018, the content of which is incorporated herein by reference.

BACKGROUND OF THE INVENTION

Field of the Invention

The present invention relates to an AD conversion circuit, an imaging device, and an endoscope system.

Description of Related Art

Physical quantity detection semiconductor devices having sensors sensitive to externally input electromagnetic waves (light, radiation, etc.) are used in various fields. A physical quantity is converted into an electrical signal by a sensor. For example, a sensor in an imaging device is a pixel. Generally, electrical signals of a reference level and a signal level are read from the sensor. For example, the reference level in the imaging device is a reset level.

In an endoscope system using an imaging device, it is important to reduce the size of the imaging device in order to reduce the size of a scope. For this reason, a CCD type imaging device has been generally used. However, since the output of the CCD type imaging device is analog, the length of the scope becomes long, so degradation of image quality due to superimposition of noise has been problematic. In recent years, in order to solve this problem, a digital-output CMOS type imaging device in which an AD conversion circuit is built has been used.

As an AD conversion circuit (ADC) of an imaging device, a single-slope-type ADC (SS-type ADC) is generally used. The SS-type ADC compares an analog signal given to one input terminal of a comparator with a reference signal given to the other input terminal of the comparator. The reference signal decreases or increases as time passes. The SS-type ADC performs AD conversion by measuring the length of time until the voltage of the analog signal and the voltage of the reference signal match each other.

After voltages of two input terminals of a differential amplifier included in the comparator are reset, the comparator starts comparison. Through the resetting, the voltages of the two input terminals become almost the same. There is a case in which some variation remains in the voltages of the two input terminals after the resetting. For this reason, there is a case in which the output of the comparator is not inverted or a malfunction occurs in which the output of the comparator is inverted immediately after the reference signal is input.

An SS-type ADC that is able to prevent the above-described malfunction is disclosed in Japanese Unexamined Patent Application. First Publication No. 2006-340044. In the ADC disclosed in Japanese Unexamined Patent Application, First Publication No. 2006-340044, after voltages of two input terminals of a differential amplifier included in a comparator are reset, a predetermined voltage is applied to the input terminal to which a reference signal is to be given. Thereafter, changing the reference signal is started and the comparator starts comparing a voltage of an analog signal with a voltage of the reference signal.

In the ADC disclosed in Japanese Unexamined Patent Application, First Publication No. 2006-340044, since the predetermined voltage is applied to the input terminal to which the reference signal is given, the voltage of the input terminal to which the reference signal is given becomes higher than the voltage of the input terminal to which the analog signal is given. For this reason, the output of the comparator is surely inverted after the comparator starts comparing the voltages.

SUMMARY OF THE INVENTION

According to a first aspect of the present invention, an AD conversion circuit includes a comparator, a reset circuit, a measurement circuit, and a first signal generation circuit. The comparator that includes a first input terminal to which a first analog signal and a second analog signal are input and a second input terminal to which a reference signal having a voltage that is configured to gradually change is input. The comparator is configured to compare a first voltage of the first input terminal with a second voltage of the second input terminal. The comparator is configured to output a signal that represents a result of comparing the first voltage with the second voltage. The comparator is configured to complete comparing the first voltage with the second voltage when an amount of the first voltage and an amount of the second voltage satisfy a predetermined condition. The reset circuit is configured to reset a voltage of the first input terminal of the comparator and a voltage of the second input terminal of the comparator when the second analog signal is input to the first input terminal of the comparator. The measurement circuit is configured to measure a length of time from a timing at which the comparator starts comparing the first voltage with the second voltage to a timing at which the comparator completes comparing the first voltage with the second voltage. The first signal generation circuit is configured to generate the second analog signal having a third voltage higher or lower than a voltage of the first analog signal. The first analog signal is input to the first input terminal of the comparator after the voltage of the first input terminal of the comparator and the voltage of the second input terminal of the comparator are reset. The comparator is configured to start comparing the first voltage with the second voltage after the first analog signal is input to the first input terminal of the comparator. A voltage of the reference signal gradually decreases when the third voltage of the second analog signal is higher than the voltage of the first analog signal. The voltage of the reference signal gradually increases when the third voltage of the second analog signal is lower than the voltage of the first analog signal.

According to a second aspect of the present invention, an imaging device includes the AD conversion circuit, a plurality of pixels, a column circuit, and a second signal generation circuit. The plurality of pixels that are disposed in a matrix shape and are configured to output a first pixel signal having a signal level and a second pixel signal having a reset level. The column circuit is disposed so as to correspond to one or more columns in an array of the plurality of pixels and is configured to generate a difference signal in accordance with a difference between the reset level and the signal level. The second signal generation circuit is configured to generate the first analog signal on the basis of the difference signal and the second analog signal.

According to a third aspect of the present invention, in the second aspect, the second signal generation circuit may include a differential amplifier, a first resistance element, and a second resistance element. The differential amplifier may include a first input terminal, a second input terminal, and an output terminal. Each of the first resistance element and the second resistance element may include a first terminal and a second terminal. The difference signal may be input to the first input terminal of the differential amplifier. The first terminals of the first resistance element and the second resistance element may be connected to the second input terminal of the differential amplifier. The second analog signal may be input to the second terminal of the first resistance element. The second terminal of the second resistance element may be connected to the output terminal of the differential amplifier.

According to a fourth aspect of the present invention, in the second aspect, the column circuit may include a first capacitance element configured to hold the difference signal. The second signal generation circuit may include a differential amplifier and a second capacitance element. The differential amplifier may include a first input terminal, a second input terminal, and an output terminal. The second capacitance element may include a first terminal and a second terminal. The difference signal may be input to the second input terminal of the differential amplifier. The first terminal of the second capacitance element may be connected to the second input terminal of the differential amplifier. The second terminal of the second capacitance element may be connected to the output terminal of the differential amplifier. A signal that is based on the second analog signal may be input to the first input terminal of the differential amplifier.

According to a fifth aspect of the present invention, an imaging device includes the AD conversion circuit, a plurality of pixels, a column circuit, and a second signal generation circuit. The plurality of pixels that are disposed in a matrix shape and are configured to output a first pixel signal having a signal level and a second pixel signal having a reset level. The first pixel signal and the second pixel signal are sequentially input to the first input terminal of the comparator as the first analog signal.

According to a sixth or seventh aspect of the present invention, in any one of the second to fifth aspects, an endoscope system includes the imaging device.

DETAILED DESCRIPTION OF THE INVENTION

Hereinafter, embodiments of the present invention will be described with reference to the drawings.

First Embodiment

Figure 1:
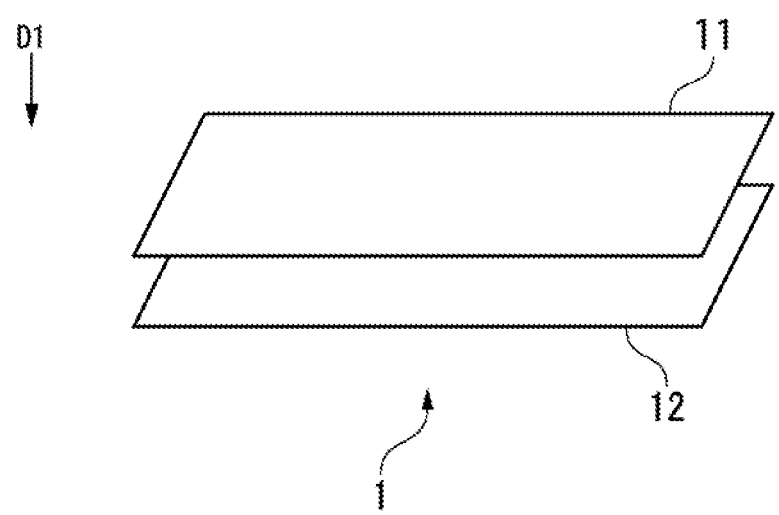
FIG. 1 is a diagram showing a configuration of an imaging device according to a first embodiment of the present invention.

FIG. 1 shows a configuration of an imaging device 1 according to a first embodiment of the present invention. As shown in FIG. 1, the imaging device 1 includes a first substrate 11 and a second substrate 12 stacked on the first substrate 11. The second substrate 12 is stacked in a stacking direction D1 with respect to the first substrate 11. The stacking direction D1 is a direction perpendicular to a main surface of the first substrate 11 or the second substrate 12. For example, the first substrate 11 and the second substrate 12 are connected to each other through Cu—Cu bonding or the like.

Figure 2:
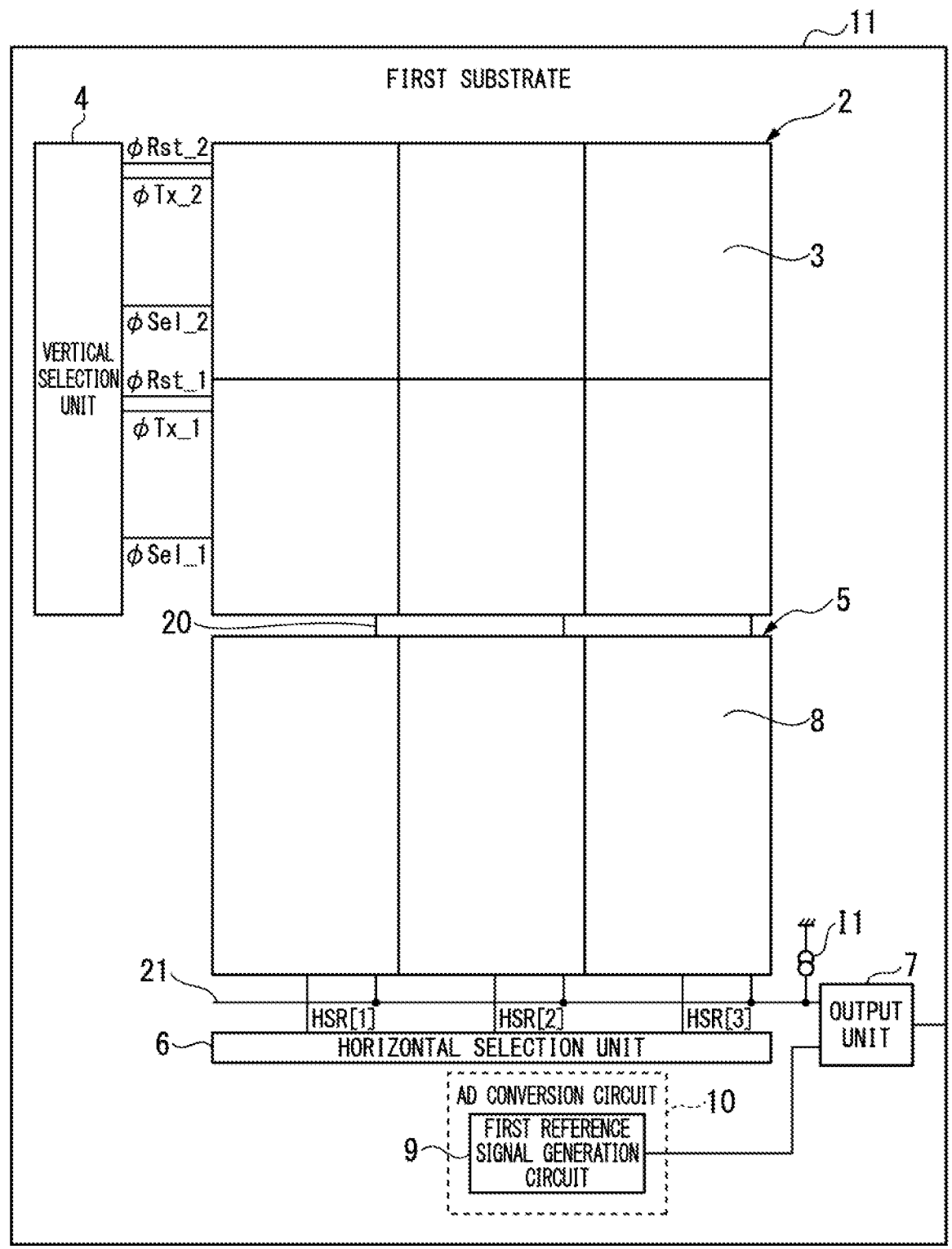
FIG. 2 is a block diagram showing a configuration of a first substrate according to the first embodiment of the present invention.

FIG. 2 shows a configuration of the first substrate 11. As shown in FIG. 2, the first substrate 11 includes an imaging unit 2, a vertical selection unit 4, a column circuit unit 5, a horizontal selection unit 6, an output unit 7, and a first reference signal generation circuit 9 (first signal generation circuit).

The imaging unit 2 includes a plurality of pixels 3 disposed in a matrix shape. The plurality of pixels 3 constitute an array having m rows and n columns. The number m and the number n are integers of two or more. The number of rows and the number of columns may not be the same. In FIG. 2, an example in which the number of rows is two and the number of columns is three is shown. This is only an example and the present invention is not limited to this. The pixel 3 outputs a first pixel signal having a signal level and a second pixel signal having a reset level.

The vertical selection unit 4 selects the pixel 3 disposed in the row direction in the array of the plurality of pixels 3. The vertical selection unit 4 controls an operation of the selected pixel 3. The vertical selection unit 4 outputs control signals for controlling the plurality of pixels 3 for each row in the array of the plurality of pixels 3. The control signals output from the vertical selection unit 4 include a transfer pulse φTx_i, a reset pulse φRst_i, and a selection pulse φSel_i. The number i is one or two. In FIG. 2, the transfer pulse φTx_1, the reset pulse φRst_1, and the selection pulse φSel_1 are output to the pixels 3 of the first row. In FIG. 2, the transfer pulse φTx_2, the reset pulse φRst_2, and the selection pulse φSel_2 are output to the pixels 3 of the second row.

The column circuit unit 5 includes a plurality of column circuits 8. The column circuit 8 is disposed for each column in the array of the plurality of pixels 3. The column circuit 8 is connected to a vertical signal line 20 extending in the vertical direction, i.e., the column direction. The vertical signal line 20 is disposed for each column in the array of the plurality of pixels 3. The vertical signal line 20 is connected to the pixels 3 of each column. The column circuit 8 is electrically connected to the pixels 3 through the vertical signal line 20. The column circuit 8 generates a difference signal in accordance with the difference between the signal level and the reset level output from the pixel 3.

The column circuit 8 is connected to a horizontal signal line 21 extending in the horizontal direction, i.e., the row direction. A selection pulse HSR[k] is output from the horizontal selection unit 6 to the column circuit 8 corresponding to a column k. The number k is any one of one, two, and three. The column circuit 8 selected on the basis of the selection pulse HSR[k] outputs the difference signal to the horizontal signal line 21.

One column circuit 8 may be disposed for a plurality of columns in the array of the plurality of pixels 3 and one column circuit 8 may be used in the plurality of columns in a time-division manner. Therefore, the column circuit 8 has only to be disposed so as to correspond to one or more columns in the array of the plurality of pixels 3.

The horizontal signal line 21 is connected to the output unit 7. A first current source I1 is connected to the horizontal signal line 21. The horizontal selection unit 6 sequentially selects the column circuits 8 by using the selection pulses HSR[1] to HSR[3]. The difference signal output from the column circuit 8 selected by the horizontal selection unit 6 is transferred to the output unit 7.

The output unit 7 outputs the difference signal output from the column circuit 8 and a first reference signal output from the first reference signal generation circuit 9 to the second substrate 12. The first reference signal generation circuit 9 generates the first reference signal and outputs the generated first reference signal to the output unit 7. The first reference signal generation circuit 9 is included in an analog-to-digital conversion circuit (AD conversion circuit) 10.

Figure 3:
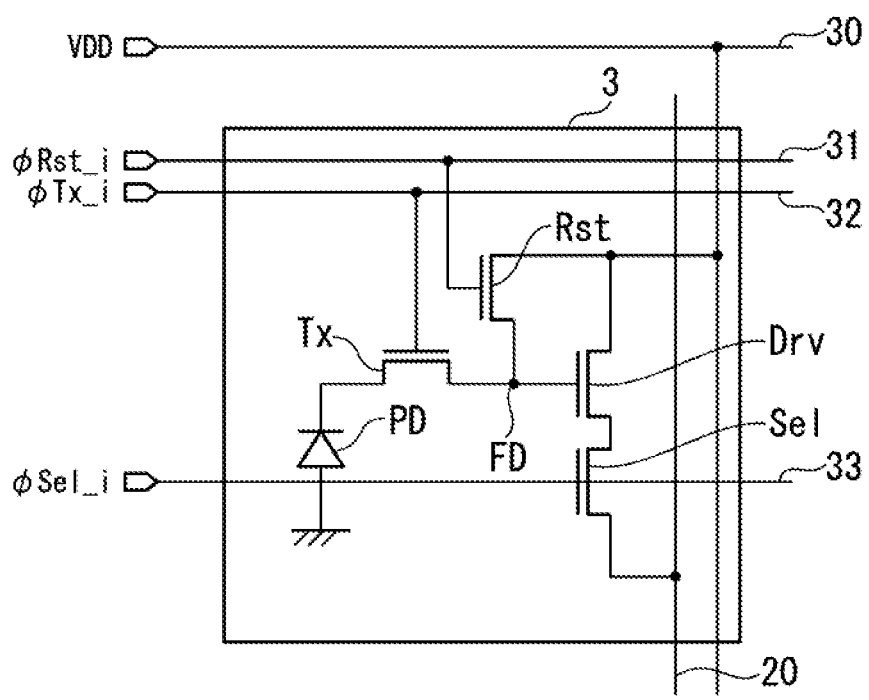
FIG. 3 is a circuit diagram showing a configuration of a pixel according to the first embodiment of the present invention.

FIG. 3 shows a configuration of the pixel 3. As shown in FIG. 3, the pixel 3 includes a photoelectric conversion unit PD, a transfer transistor Tx, a charge storage portion FD, a reset transistor Rst, an amplification transistor Drv, and a selection transistor Sel. Each transistor shown in FIG. 3 is an NMOS transistor. Each transistor shown in FIG. 3 includes a gate terminal, a source terminal, and a drain terminal.

For example, the photoelectric conversion unit PD is a photodiode. The photoelectric conversion unit PD includes a first terminal and a second terminal. The first terminal of the photoelectric conversion unit PD is connected to the ground. The second terminal of the photoelectric conversion unit PD is connected to the transfer transistor Tx.

The source terminal of the transfer transistor Tx is connected to the second terminal of the photoelectric conversion unit PD. The drain terminal of the transfer transistor Tx is connected to the charge storage portion FD. The gate terminal of the transfer transistor Tx is connected to a control signal line 32. The control signal line 32 extends from the vertical selection unit 4 in the row direction in the array of the plurality of pixels 3. The control signal line 32 transfers the transfer pulse φTx_i.

The drain terminal of the reset transistor Rst is connected to a power source line 30. The power source line 30 is connected to a power source that outputs a power source voltage VDD. The source terminal of the reset transistor Rst is connected to the charge storage portion FD. The gate terminal of the reset transistor Rst is connected to a control signal line 31. The control signal line 31 extends from the vertical selection unit 4 in the row direction in the array of the plurality of pixels 3. The control signal line 31 transfers the reset pulse φRst_i.

The drain terminal of the amplification transistor Drv is connected to the power source line 30. The source terminal of the amplification transistor Drv is connected to the selection transistor Sel. The gate terminal of the amplification transistor Drv is connected to the charge storage portion FD.

The drain terminal of the selection transistor Sel is connected to the source terminal of the amplification transistor Drv. The source terminal of the selection transistor Sel is connected to the vertical signal line 20. The gate terminal of the selection transistor Sel is connected to a control signal line 33. The control signal line 33 extends from the vertical selection unit 4 in the row direction in the array of the plurality of pixels 3. The control signal line 33 transfers the selection pulse φSel_i.

The transfer transistor Tx is controlled on the basis of the transfer pulse φTx_i output from the vertical selection unit 4. The transfer transistor Tx of the pixel 3 of the first row is controlled on the basis of the transfer pulse φTx_1 and the transfer transistor Tx of the pixel 3 of the second row is controlled on the basis of the transfer pulse φTx_2. The reset transistor Rst is controlled on the basis of the reset pulse φRst_i output from the vertical selection unit 4. The reset transistor Rst of the pixel 3 of the first row is controlled on the basis of the reset pulse φRst_1 and the reset transistor Rst of the pixel 3 of the second row is controlled on the basis of the reset pulse φRst_2. The selection transistor Sel is controlled on the basis of the selection pulse φSel_i output from the vertical selection unit 4. The selection transistor Sel of the pixel 3 of the first row is controlled on the basis of the selection pulse φSel_1 and the selection transistor Sel of the pixel 3 of the second row is controlled on the basis of the selection pulse φSel_2.

The photoelectric conversion unit PD generates signal charge in accordance with the amount of incident light. The transfer transistor Tx transfers the signal charge generated by the photoelectric conversion unit PD to the charge storage portion PD. For example, the charge storage portion FD is a floating diffusion. The charge storage portion FD stores the signal charge transferred by the transfer transistor Tx. The reset transistor Rst resets the charge storage portion FD to a predetermined voltage. The amplification transistor Drv generates a pixel signal by amplifying a signal in accordance with a voltage of the charge storage portion FD. The selection transistor Sel outputs the pixel signal to the vertical signal line 20. The vertical signal line 20 is disposed for each column in the array of the plurality of pixels 3. The first pixel signal having the signal level and the second pixel signal having the reset level are output from the pixel 3. The signal level has a voltage that is based on the signal charge generated by the photoelectric conversion unit PD. The reset level has a voltage that is based on the voltage of the charge storage portion FD when the voltage of the charge storage portion FD is reset.

Figure 4:
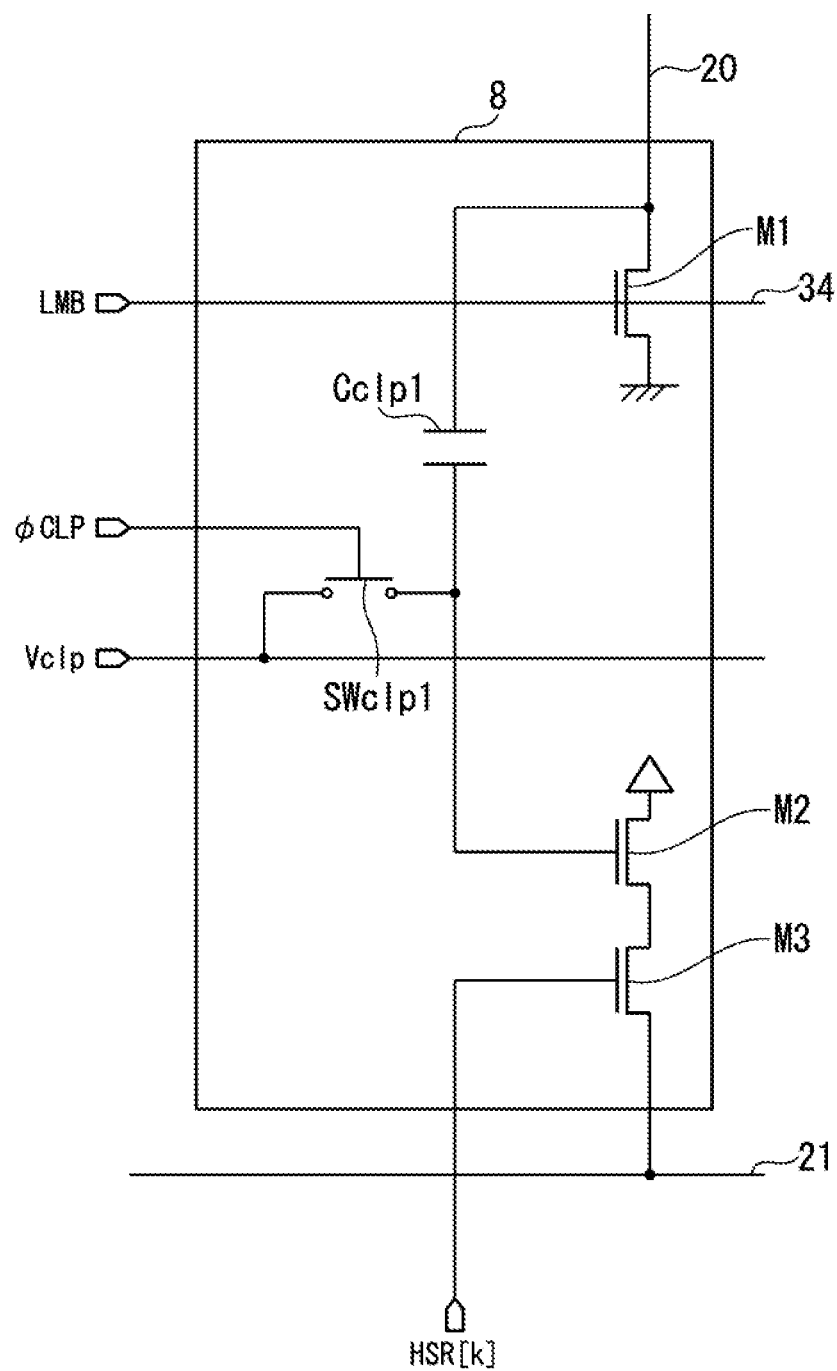
FIG. 4 is a circuit diagram showing a configuration of a column circuit according to the first embodiment of the present invention.

FIG. 4 shows a configuration of the column circuit 8. As shown in FIG. 4, the column circuit 8 includes a transistor M1, a capacitance element Cclp1, a clamp switch SWclp1, an amplification transistor M2, and a column selection transistor M3. Each transistor shown in FIG. 4 is an NMOS transistor. Each transistor shown in FIG. 4 includes a gate terminal, a source terminal, and a drain terminal.

The drain terminal of the transistor M1 is connected to the vertical signal line 20. The source terminal of the transistor M1 is connected to the ground. The gate terminal of the transistor M1 is connected to the power source line 34. The power source line 34 is connected to a power source that outputs a predetermined voltage LMB.

The capacitance element Cclp1 includes a first terminal and a second terminal. The first terminal of the capacitance element Cclp1 is connected to the vertical signal line 20. The second terminal of the capacitance element Cclp1 is connected to the clamp switch SWclp1 and the amplification transistor M2.

The clamp switch SWclp1 includes a first terminal and a second terminal. The first terminal of the clamp switch SWclp1 is connected to the second terminal of the capacitance element Cclp1. A clamp voltage Vclp is input to the second terminal of the clamp switch SWclp1.

The power source voltage VDD is input to the drain terminal of the amplification transistor M2. The source terminal of the amplification transistor M2 is connected to the column selection transistor M3. The gate terminal of the amplification transistor M2 is connected to the second terminal of the capacitance element Cclp1.

The drain terminal of the column selection transistor M3 is connected to the source terminal of the amplification transistor M2. The source terminal of the column selection transistor M3 is connected to the horizontal signal line 21. The gate terminal of the column selection transistor M3 is connected to the horizontal selection unit 6.

An operation of the clamp switch SWclp1 is controlled on the basis of a clamp pulse φCLP. An operation of the column selection transistor M3 is controlled on the basis of a selection pulse HSR[k] output from the horizontal selection unit 6. The number k is any one of one, two, and three.

The transistor M1 functions as a current source. The state of the clamp switch SWclp1 becomes any one of an ON state and an OFF state. When the clamp switch SWclp1 is in the ON state, the capacitance element Cclp1 is clamped to the clamp voltage Vclp. After the capacitance element Cclp1 is clamped, the capacitance element Cclp1 holds the pixel signal in accordance with the difference between the reset level and the signal level output from the pixel 3 to the vertical signal line 20. The capacitance element Cclp1 is a clamp capacitor. The amplification transistor M2 generates the difference signal in accordance with the difference between the reset level and the signal level by amplifying the pixel signal held in the capacitance element Cclp1. The column selection transistor M3 outputs the difference signal generated by the amplification transistor M2 to the horizontal signal line 21. The column selection transistor M3 of the first column is controlled on the basis of a selection pulse HSR[1]. The column selection transistor M3 of the second column is controlled on the basis of a selection pulse HSR[2]. The column selection transistor M3 of the third column is controlled on the basis of a selection pulse HSR[3].

Figure 5:
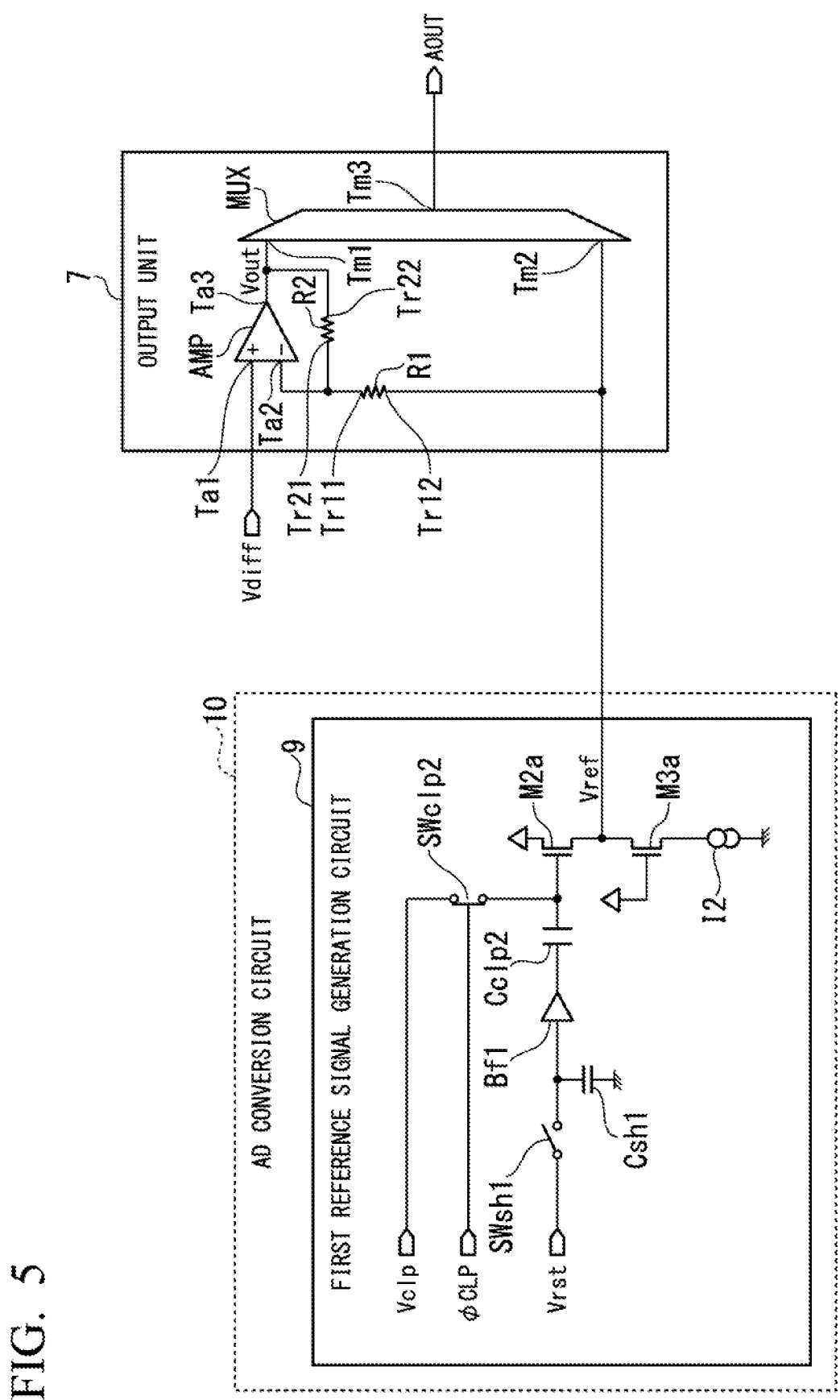
FIG. 5 is a circuit diagram showing a configuration of a first reference signal generation circuit and an output unit according to the first embodiment of the present invention.

FIG. 5 shows a configuration of the first reference signal generation circuit 9 and the output unit 7. As shown in FIG. 5, the first reference signal generation circuit 9 includes a sample switch SWsh1, a capacitance element Csh1, a buffer Bf1, a capacitance element Cclp2, a clamp switch SWclp2, an amplification transistor M2a, a selection transistor M3a, and a second current source I2.

The sample switch SWsh1 includes a first terminal and a second terminal. A voltage Vrst is input to the first terminal of the sample switch SWsh1. The second terminal of the sample switch SWsh1 is connected to the capacitance element Csh1.

The capacitance element Csh1 includes a first terminal and a second terminal. The first terminal of the capacitance element Csh1 is connected to the second terminal of the sample switch SWsh1. The second terminal of the capacitance element Csh1 is connected to the ground.

The buffer Bf1 includes a first terminal and a second terminal. The first terminal of the buffer Bf1 is connected to the second terminal of the sample switch SWsh1 and the first terminal of the capacitance element Csh1. The second terminal of the buffer Bf1 is connected to the capacitance element Cclp2.

The capacitance element Cclp2 includes a first terminal and a second terminal. The first terminal of the capacitance element Cclp2 is connected to the second terminal of the buffer Bf1. The second terminal of the capacitance element Cclp2 is connected to the clamp switch SWclp2 and the amplification transistor M2a.

The clamp switch SWclp2 includes a first terminal and a second terminal. The first terminal of the clamp switch SWclp2 is connected to the second terminal of the capacitance element Cclp2. The clamp voltage Vclp is input to the second terminal of the clamp switch SWclp2.

The amplification transistor M2a and the selection transistor M3a are NMOS transistors. Each of the amplification transistor M2a and the selection transistor M3a includes a gate terminal, a source terminal, and a drain terminal. The power source voltage VDD is input to the drain terminal of the amplification transistor M2a. The source terminal of the amplification transistor M2a is connected to the selection transistor M3a and the output unit 7. The gate terminal of the amplification transistor M2a is connected to the second terminal of the capacitance element Cclp2.

The drain terminal of the selection transistor M3a is connected to the source terminal of the amplification transistor M2a. The source terminal of the selection transistor M3a is connected to the second current source I2. The power source voltage VDD is input to the gate terminal of the selection transistor M3a.

The state of the sample switch SWsh1 becomes any one of an ON state and an OFF state. When the sample switch SWsh1 is in the ON state, the sample switch SWsh1 samples the voltage Vrst. When the state of the sample switch SWsh1 changes from the ON state to the OFF state, the voltage Vrst sampled by the sample switch SWsh1 is held in the capacitance element Cclp2 through the buffer Bf1.

The state of the clamp switch SWclp2 becomes any one of an ON state and an OFF state. When the clamp switch SWclp2 is in the ON state, the capacitance element Cclp2 is clamped to the clamp voltage Vclp. The operation of the clamp switch SWclp2 is controlled on the basis of the clamp pulse ϕCLP.

The capacitance element Cclp2 holds the voltage (Vclp) clamped by the clamp switch SWclp2. The capacitance element Cclp2 is a clamp capacitor. The amplification transistor M2a generates a first reference signal Vref by amplifying the voltage of the second terminal of the capacitance element Cclp2. In other words, the amplification transistor M2a generates the first reference signal Vref on the basis of the voltage of the second terminal of the capacitance element Cclp2. The amplification transistor M2a outputs the generated first reference signal Vref to the output unit 7.

The capacitance element Cclp2, the clamp switch SWclp2, the amplification transistor M2a, and the selection transistor M3a in the first reference signal generation circuit 9 are constituted similarly to the capacitance element Cclp1, the clamp switch SWclp1, the amplification transistor M2, and the column selection transistor M3, respectively, in the column circuit 8.

As shown in FIG. 5, the output unit 7 includes a differential amplifier AMP, a resistance element R1, a resistance element R2, and a selector MUX.

The differential amplifier AMP includes a first input terminal Ta1, a second input terminal Ta2, and an output terminal Ta3. The first input terminal Ta1 of the differential amplifier AMP is a non-inverting input terminal and the second input terminal Ta2 of the differential amplifier AMP is an inverting input terminal.

The first input terminal Ta1 of the differential amplifier AMP is connected to the horizontal signal line 21. A difference signal Vdiff output from the column circuit 8 is input to the first input terminal Ta1 of the differential amplifier AMP. The second input terminal Ta2 of the differential amplifier AMP is connected to the resistance element R1 and the resistance element R2. A signal that is based on the first reference signal Vref output from the first reference signal generation circuit 9 is input to the second input terminal Ta2 of the differential amplifier AMP. The output terminal Ta3 of the differential amplifier AMP is connected to the selector MUX. The differential amplifier AMP outputs an analog signal Vout in accordance with the difference between the voltage of the first input terminal Ta1 and the voltage of the second input terminal Ta2 from the output terminal Ta3 to the selector MIX.

The resistance element R1 includes a first terminal Tr11 and a second terminal Tr12. The first terminal Tr11 of the resistance element R1 is connected to the second input terminal Ta2 of the differential amplifier AMP. The second terminal Tr12 of the resistance element R1 is connected to the source terminal of the amplification transistor M2a. The first reference signal Vref output from the first reference signal generation circuit 9 is input to the second terminal Tr12 of the resistance element R1.

The resistance element R2 includes a first terminal Tr21 and a second terminal Tr22. The first terminal Tr21 of the resistance element R2 is connected to the second input terminal Ta2 of the differential amplifier AMP. The second terminal Tr22 of the resistance element R2 is connected to the output terminal Ta3 of the differential amplifier AMP. The gain of the differential amplifier AMP is decided on in accordance with the resistance values of the resistance element R1 and the resistance element R2.

The selector MUX includes a first input terminal Tm1, a second input terminal Tm2, and an output terminal Tm3. The first input terminal Tm1 of the selector MUX is connected to the output terminal Ta3 of the differential amplifier AMP. The second input terminal Tm2 of the selector MUX is connected to the source terminal of the amplification transistor M2a. The analog signal Vout output from the differential amplifier AMP is input to the first input terminal Tm1 of the selector MUX. The first reference signal Vref output from the first reference signal generation circuit 9 is input to the second input terminal Tm2 of the selector MUX. The selector MUX sequentially outputs the analog signal Vout and the first reference signal Vref as an analog signal AOUT to the second substrate 12.

After the second pixel signal having the reset level is output to the vertical signal line 20, the clamp pulse ϕCLP changes from a low level to a high level. In this way, the clamp switch SWclp1 and the clamp switch SWclp2 are turned on. At this time, the second terminal of the capacitance element Cclp1 and the second terminal of the capacitance element Cclp2 are clamped to the clamp voltage Vclp. In addition, the voltage of the source terminal of the column selection transistor M3 and the voltage of the source terminal of the selection transistor M3a are almost the same.

Thereafter, the first pixel signal having the signal level is output to the vertical signal line 20. The signal level is less than or equal to the reset level. As described above, the column circuit 8 and the first reference signal generation circuit 9 are constituted similarly to each other. When the first pixel signal having the signal level is output to the vertical signal line 20, the voltage of the source terminal of the column selection transistor M3, i.e., the voltage of the difference signal Vdiff is less than or equal to the voltage of the source terminal of the selection transistor M3a. The voltage of the source terminal of the amplification transistor M2a, i.e., the voltage of the first reference signal Vref is higher than the voltage of the source terminal of the selection transistor M3a by a voltage $\Delta V_{REF}$. Following Expression (1) represents the voltage $\Delta V_{REF}$.

$$\Delta V_{REF} = R_{ON} \times I \quad (1)$$

In Expression (1), $R_{ON}$ is a resistance value of the selection transistor M3a when the selection transistor M3a is in the ON state. In Expression (1), I is a current value of the second current source I2. Therefore, the voltage of the source terminal of the amplification transistor M2a is higher than the voltage of the source terminal of the column selection transistor M3. In other words, the voltage of the first reference signal Vref is higher than the voltage of the difference signal Vdiff.

The above-described configuration is an example. For example, the current value of the first current source I1 and the current value of the second current source I2 may be different from each other. In this way, the voltage drop in the amplification transistor M2 and the amplification transistor M2a can be controlled. The voltage drop in the amplification transistor M2 and the amplification transistor M2a may be controlled such that the voltage of the first reference signal Vref is higher than the voltage of the difference signal Vdiff. The configuration for causing the voltage of the first reference signal Vref to be higher than the voltage of the difference signal Vdiff is not limited to the above-described configuration.

The differential amplifier AMP, the resistance element R1, and the resistance element R2 are a non-inverting amplifier. Following Expression (2) represents the voltage $V_{OUT}$ of the analog signal Vout output from the output terminal Ta3 of the differential amplifier AMP.

$$V_{OUT} = \frac{R_1 + R_2}{R_1} \times (V_{DIFF} - V_{REF}) + V_{REF} \quad (2)$$

In Expression (2), $R_1$ and $R_2$ are the resistance value of the resistance element R1 and the resistance value of the resistance element R2, respectively. In Expression (2), $V_{DIFF}$ is the voltage of the difference signal Vdiff. In Expression (2), $V_{REF}$ is the voltage of the first reference signal Vref.

The first reference signal Vref and the analog signal Vout are sequentially output as the analog signal AOUT from the selector MUX. Digital data in accordance with the difference between the first reference signal Vref and the analog signal Vout are generated by the AD conversion circuit 10. Since the voltage $V_{REF}$ of the first reference signal Vref is higher than the voltage $V_{DIFF}$ of the difference signal Vdiff, the first term on the right side of Expression (2) is a negative value. For this reason, the voltage $V_{OUT}$ of the analog signal Vout is lower than the voltage $V_{REF}$ of the first reference signal Vref.

Figure 6:
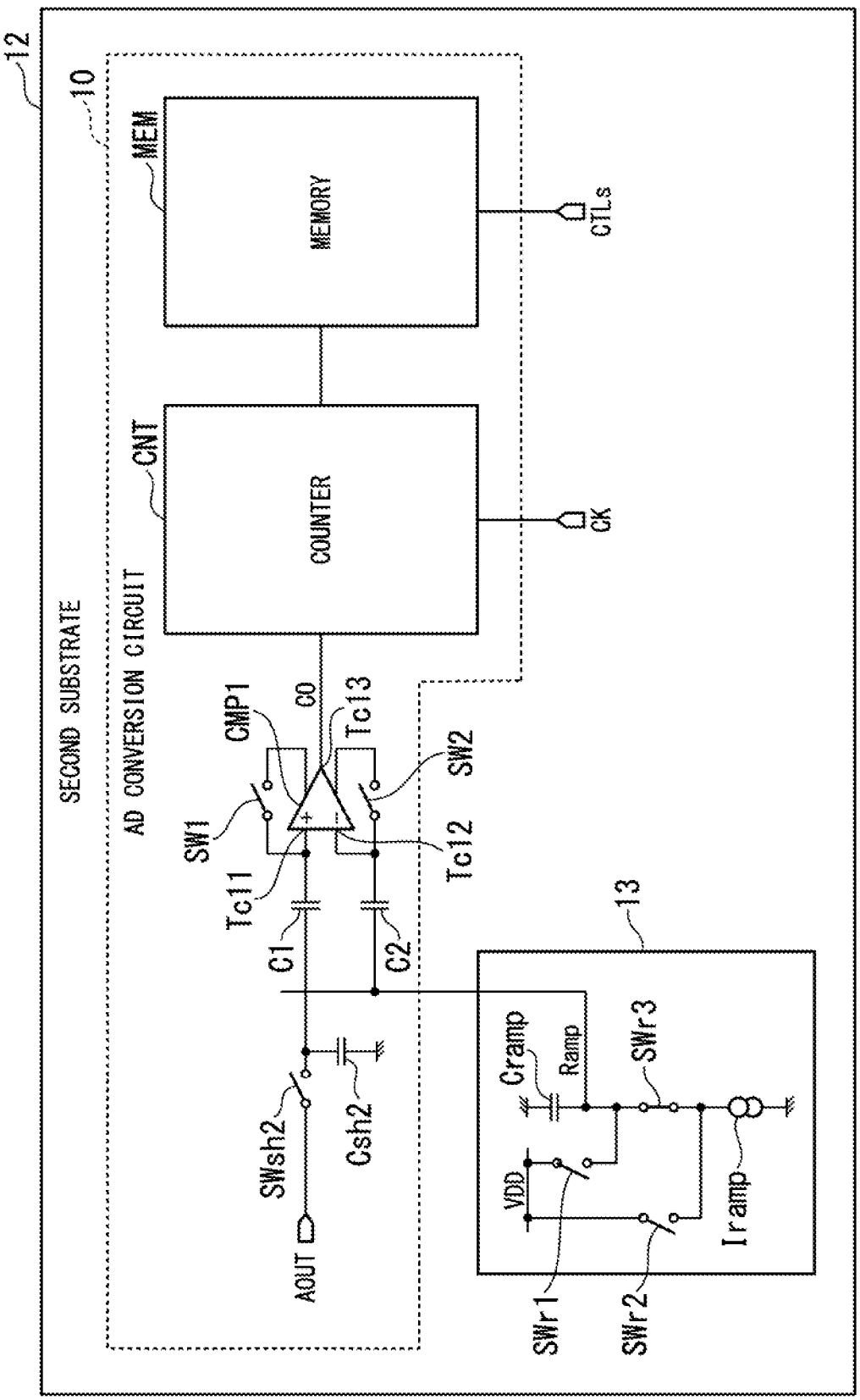
FIG. 6 is a circuit diagram showing a configuration of a second substrate according to the first embodiment of the present invention.

FIG. 6 shows a configuration of the second substrate 12. As shown in FIG. 6, the second substrate 12 includes the AD conversion circuit 10 and a second reference signal generation circuit 13.

The second reference signal generation circuit 13 includes a switch SWr1, a switch SWr2, a switch SWr3, a capacitance element Cramp, and a current source Iramp.

The switch SWr1 and the switch SWr2 include a first terminal and a second terminal. The power source voltage VDD is input to the first terminals of the switch SWr1 and the switch SWr2. The second terminals of the switch SWr1 and the switch SWr2 are connected to the switch SWr3.

The capacitance element Cramp includes a first terminal and a second terminal. The first terminal of the capacitance element Cramp is connected to the ground. The second terminal of the capacitance element Cramp is connected to the switch SWr3.

The switch SWr3 includes a first terminal and a second terminal. The first terminal of the switch SWr3 is connected to the second terminal of the switch SWr1 and the second terminal of the capacitance element Cramp. The second terminal of the switch SWr3 is connected to the second terminal of the switch SWr2 and the current source Iramp.

First, the switch SWr1 and the switch SWr2 are turned on and the switch SWr3 is turned off. In this way, the voltage of a second reference signal Ramp output from the second terminal of the capacitance element Cramp becomes the power source voltage VDD. Thereafter, the switch SWr1 and the switch SWr2 are turned off and the switch SWr3 is turned on. In this way, the voltage of the second reference signal Ramp gradually decreases. In other words, the voltage of the second reference signal Ramp monotonically decreases in a slant manner. The rate of the change in the voltage of the second reference signal Ramp is not necessarily constant.

The AD conversion circuit 10 includes a sample switch SWsh2, a capacitance element Csh2, a capacitance element C1, a capacitance element 2, a comparator CMP1, a switch SW1, a switch SW2, a counter CNT, and a memory MEM.

The sample switch SWsh2 includes a first terminal and a second terminal. The first terminal of the sample switch SWsh2 is connected to the output terminal Tm3 of the selector MUX. The analog signal AOUT is input to the first terminal of the sample switch SWsh2. The second terminal of the sample switch SWsh2 is connected to the capacitance element Csh2.

The capacitance element Csh2 includes a first terminal and a second terminal. The first terminal of the capacitance element Csh2 is connected to the second terminal of the sample switch SWsh2. The second terminal of the capacitance element Csh2 is connected to the ground.

The capacitance element C1 includes a first terminal and a second terminal. The first terminal of the capacitance element C1 is connected to the second terminal of the sample switch SWsh2 and a first terminal of the capacitance element Csh2. The second terminal of the capacitance element C1 is connected to the comparator CMP1.

The capacitance element C2 includes the first terminal and a second terminal. The first terminal of the capacitance element C2 is connected to the second terminal of the capacitance element Cramp of the second reference signal generation circuit 13. The second terminal of the capacitance element C2 is connected to the comparator CMP1.

The comparator CMP1 includes a first input terminal Tc11, a second input terminal Tc12, and an output terminal Tc13. The first input terminal Tc11 of the comparator CMP1 is connected to the second terminal of the capacitance element C1. The second input terminal Tc12 of the comparator CMP1 is connected to the second terminal of the capacitance element C2. The output terminal Tc3 of the comparator CMP1 is connected to the counter CNT.

The switch SW1 includes a first terminal and a second terminal. The first terminal of the switch SW1 is connected to the first input terminal Tc11 of the comparator CMP1. The second terminal of the switch SW1 is connected to a first node in the comparator CMP1.

The switch SW2 includes a first terminal and a second terminal. The first terminal of the switch SW2 is connected to the second input terminal Tc12 of the comparator CMP1. The second terminal of the switch SW2 is connected to a second node in the comparator CMP1.

The state of the sample switch SWsh2 becomes any one of an ON state and an OFF state. When the sample switch SWsh2 is in the ON state, the sample switch SWsh2 samples the voltage of the analog signal AOUT. When the state of the sample switch SWsh2 changes from the ON state to the OFF state, the voltage sampled by the sample switch SWsh2 is held in the capacitance element Csh2.

The voltage held in the capacitance element Csh2 is input to the first input terminal Tc11 of the comparator CMP1 through the capacitance element C1. The second reference signal Ramp output from the second reference signal generation circuit 13 is input to the second input terminal Tc12 of the comparator CMP1 through the capacitance element C2.

The state of the switch SW1 and the switch SW2 becomes any one of an ON state and an OFF state. When the switch SW1 is in the ON state, the switch SW1 resets the voltage of the first input terminal Tc11 of the comparator CMP1. When the switch SW2 is in the ON state, the switch SW2 resets the voltage of the second input terminal Tc12 of the comparator CMP1. After the reset is performed, the voltages of the first input terminal Tc11 and the second input terminal Tc12 of the comparator CMP1 are almost the same.

The comparator CMP1 compares the voltage of the first input terminal Tc11 with the voltage of the second input terminal Tc12. The voltage of the first input terminal Tc11 is a voltage in accordance with the difference between the voltage of the analog signal Vout and the voltage of the first reference signal Vref. The comparator CMP1 outputs a signal CO that represents the result of comparison from the output terminal Tc13.

The signal CO output from the comparator CMP1 is input to the counter CNT. For example, the counter CNT is a counter of ten bits. The counter CNT counts the length of time until the signal CO is inverted on the basis of a clock CK. In this way, the counter CNT measures the length of time until the amount relationship between the voltage of the first input terminal Tc11 of the comparator CMP1 and the voltage of the second input terminal Tc12 of the comparator CMP1 changes. The count value held in the counter CNT when the signal CO is inverted corresponds to the voltage in accordance with the difference between the voltage of the analog signal Vout and the voltage of the first reference signal Vref. The counter CNT generates digital data of ten bits in accordance with the difference. The digital data generated by the counter CNT are output to the memory MEM.

The memory MEM stores the digital data output from the counter CNT. The memory MEM outputs the digital data to a subsequent-stage circuit of the imaging device 1. Storage and output of the digital data by the memory MEM are controlled on the basis of a control signal CTLs.

Figure 7:
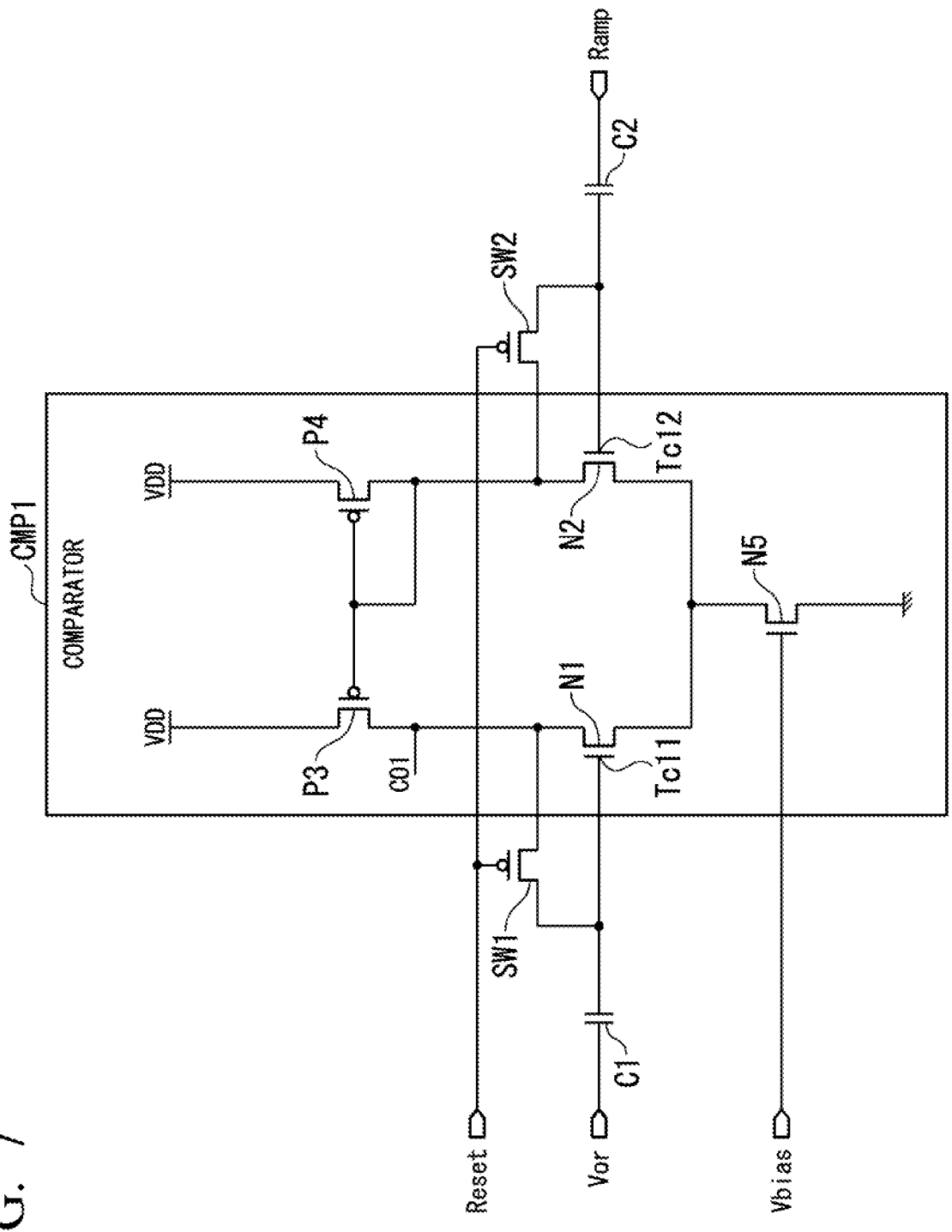
FIG. 7 is a circuit diagram showing a configuration of a comparator according to the first embodiment of the present invention.

FIG. 7 shows a configuration of the comparator CMP1. The comparator CMP1 is constituted as a differential amplifier. The comparator CMP1 includes a transistor N1, a transistor N2, a transistor P3, a transistor P4, and a transistor N5. The transistor N1, the transistor N2, and the transistor N5 are NMOS transistors. The transistor P3 and the transistor P4 are PMOS transistors. Each transistor shown in FIG. 7 includes a gate terminal, a source terminal, and a drain terminal.

The power source voltage VDD is input to the source terminals of the transistor P3 and the transistor P4. The gate terminals of the transistor P3 and the transistor P4 are connected to each other.

The drain terminal of the transistor N1 is connected to the drain terminal of the transistor P3. The gate terminal of the transistor N1 is the first input terminal Tc11 of the comparator CMP1. The gate terminal of the transistor N1 is connected to the second terminal of the capacitance element C1.

The drain terminal of the transistor N2 is connected to the drain terminal and the gate terminal of the transistor P4. The gate terminal of the transistor N2 is the second input terminal Tc12 of the comparator CMP1. The gate terminal of the transistor N2 is connected to the second terminal of the capacitance element C2.

The drain terminal of the transistor N5 is connected to the source terminals of the transistor N1 and the transistor N2. The source terminal of the transistor N5 is connected to the ground. A bias voltage Vbias for controlling a current value is input to the gate terminal of the transistor N5.

The drain terminal of the transistor N1 is connected to a latch circuit not shown in FIG. 7. A voltage CO1 of the drain terminal of the transistor N1 is input to the latch circuit. The latch circuit outputs the signal CO having a voltage in accordance with the voltage CO1 to the counter CNT.

The switch SW1 and the switch SW2 are PMOS transistors. Each of the switch SW1 and the switch SW2 includes a gate terminal, a source terminal, and a drain terminal.

The drain terminal of the switch SW1 is connected to the drain terminals of the transistor N1 and the transistor P3. The source terminal of the switch SW1 is connected to the second terminal of the capacitance element C1 and the gate terminal of the transistor N1. A reset pulse Reset is input to the gate terminal of the switch SW1.

The drain terminal of the switch SW2 is connected to the drain terminals of the transistor N2 and the transistor P4. The source terminal of the switch SW2 is connected to the second terminal of the capacitance element C2 and the gate terminal of the transistor N2. A reset pulse Reset is input to the gate terminal of the switch SW2.

When the reset pulse Reset changes from the high level to the low level, the switch SW1 and the switch SW2 are turned on. At this time, the switch SW1 resets the voltage of the gate terminal of the transistor N1, i.e., the first input terminal Tc11 of the comparator CMP1. In addition, the switch SW2 resets the voltage of the gate terminal of the transistor N2, i.e., the second input terminal Tc12 of the comparator CMP1.

Figure 8:
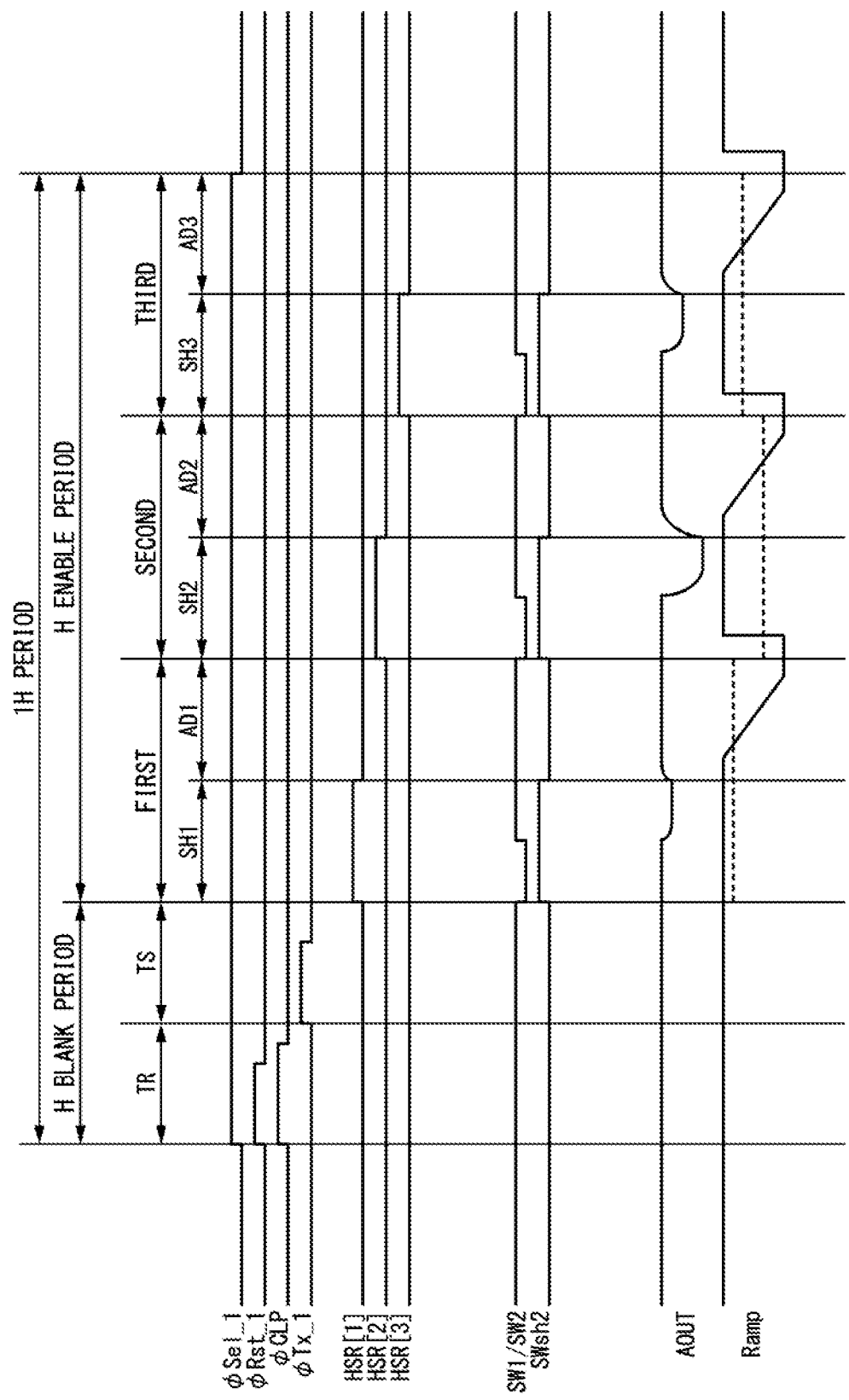
FIG. 8 is a timing chart showing an operation of the imaging device according to the first embodiment of the present invention.

An operation of the imaging device 1 will be described. FIG. 8 shows the operation of the imaging device 1. Hereinafter, an operation in which the imaging device 1 reads a pixel signal will be described. As a representative, the operation in which the imaging device 1 reads the pixel signal from the pixel 3 of the first row in the array of the plurality of pixels 3 will be described.

In FIG. 8, waveforms of the selection pulse φSel_1, the reset pulse φRst_1, the clamp pulse φCLP, the transfer pulse φTx_1, the selection pulse HSR[1], the selection pulse HSR[2], and the selection pulse HSR[3] are shown. In FIG. 8, a waveform of a control signal of each of the switch SW1, the switch SW2, and the sample switch SWsh2 is shown. In FIG. 8, waveforms of the analog signal AOUT and the second reference signal Ramp are shown. The horizontal direction in FIG. 8 represents time and the vertical direction in FIG. 8 represents voltage.

A 1H period in which a pixel signal of one row is read includes an H blank period and an H enable period. The H blank period includes a first reading period TR in which the second pixel signal having the reset level is read and a second reading period TS in which the first pixel signal having the signal level is read. Before the 1H period is started, the selection pulse φSel_1, the reset pulse φRst_1, the clamp pulse φCLP, the transfer pulse φTx_1, the selection pulse HSR[1], the selection pulse HSR[2], and the selection pulse HSR[3] are at the low level.

The H enable period includes a plurality of periods in which the AD conversion circuit 10 sequentially performs AD conversion a plurality of times. A period in which AD conversion of each time is performed includes a sample-and-hold period and an AD conversion period. Before the first AD conversion is performed, the control signal of each of the switch SW1 and the switch SW2 is at the high level and the control signal of the sample switch SWsh2 is at the low level.

When the H blank period is started, the selection pulse φSel_1 output from the vertical selection unit 4 to the pixel 3 of the first row changes from the low level to the high level. For this reason, the selection transistor Sel is turned on. In this way, the pixel 3 of the first row is selected in the first reading period TR. At the same time, a sample-and-hold pulse not shown in FIG. 8 changes from the low level to the high level. For this reason, the sample switch SWsh1 is turned on. Thereafter, the sample-and-hold pulse changes from the high level to the low level. For this reason, the sample switch SWsh1 is turned off. In this way, the voltage Vrst sampled by the sample switch SWsh1 is held by the capacitance element Cclp2 through the buffer Bf1.

(Reading of Reset Level)

The reset pulse ϕRst_1 output from the vertical selection unit 4 to the pixel 3 of the first row changes from the low level to the high level. For this reason, the reset transistor Rst is turned on. In this way, the charge storage portion FD is reset and the second pixel signal having the reset level is output to the vertical signal line 20. Furthermore, the clamp pulse ϕCLP changes from the low level to the high level. For this reason, the clamp switch SWclp1 and the clamp switch SWclp2 are turned on. In this way, the capacitance element Cclp1 and the capacitance element Cclp2 are clamped to the clamp voltage Vclp.

Thereafter, the reset pulse ϕRst_1 changes from the high level to the low level. For this reason, the reset transistor Rst is turned off. Thereafter, the clamp pulse ϕCLP changes from the high level to the low level. For this reason, the clamp switch SWclp1 and the clamp switch SWclp2 are turned off. In this way, the clamp voltage Vclp is held in the capacitance element Cclp1 and the capacitance element Cclp2.

(Reading of Signal Level)

The transfer pulse ϕTx_1 output from the vertical selection unit 4 to the pixel 3 of the first row changes from the low level to the high level in the second reading period TS. For this reason, the transfer transistor Tx is turned on. In this way, the signal charge of the photoelectric conversion unit PD is transferred to the charge storage portion FD and the first pixel signal having the signal level is output to the vertical signal line 20. Thereafter, the transfer pulse ϕTx_1 changes from the high level to the low level. For this reason, the transfer transistor Tx is turned off. In this way, the difference signal in accordance with the difference between the reset level and the signal level is held in the capacitance element Cclp1.

When the second reading period TS is completed, the H enable period is started and the first AD conversion is started. At this time, the selection pulse HSR[1] output from the horizontal selection unit 6 to the column circuit 8 of the first column changes from the low level to the high level. For this reason, the column selection transistor M3 is turned on. In this way, the difference signal Vdiff in accordance with the difference between the reset level and the signal level of the pixel 3 in the first row and the first column is output to the horizontal signal line 21. Thereafter, the selection pulse HSR[1] changes from the high level to the low level. For this reason, the column selection transistor M3 is turned off. According to the above-described operation, the difference signal Vdiff in accordance with the difference between the reset level and the signal level of the pixel 3 in the first row and the first column is read.

The period in which the first AD conversion is performed includes a sample-and-hold period SH1 and an AD conversion period AD1. When the sample-and-hold period SH1 is started, the control signal of each of the switch SW1 and the switch SW2 becomes the low level and the control signal of the sample switch SWsh2 becomes the high level. In this way, the switch SW1, the switch SW2, and the sample switch SWsh2 are turned on. In addition, when the sample-and-hold period SH1 is started, the selector MUX outputs the first reference signal Vref as the analog signal AOUT and the second reference signal generation circuit 13 outputs a predetermined voltage as the second reference signal Ramp.

Since the sample switch SWsh2 is in the ON state, the first reference signal Vref is sampled by the sample switch SWsh2. The voltage sampled by the sample switch SWsh2 is input to the first input terminal Tc11 of the comparator CMP1 through the capacitance element C1. In addition, since the switch SW1 and the switch SW2 are in the ON state, the switch SW1 resets the voltage of the first input terminal Tc11 of the comparator CMP1 and the switch SW2 resets the voltage of the second input terminal Tc12 of the comparator CMP1. Through the resetting, the voltages of the first input terminal Tc11 and the second input terminal Tc12 of the comparator CMP1 become almost the same.

In the operation shown in FIG. 8, the voltages of the first input terminal Tc11 and the second input terminal Tc12 of the comparator CMP1 are reset at the timing at which the voltage of the first reference signal Vref is input to the first input terminal Tc11 of the comparator CMP1. The voltages of the first input terminal Tc11 and the second input terminal Tc12 of the comparator CMP1 may be reset immediately after the voltage of the first reference signal Vref is input to the first input terminal Tc11 of the comparator CMP1.

Thereafter, the control signal of each of the switch SW1 and the switch SW2 becomes the high level. In this way, the switch SW1 and the switch SW2 are turned off. In other words, the resetting by the switch SW1 and the switch SW2 is completed. At this time, the selector MUX outputs the analog signal Vout as the analog signal AOUT.

Since the sample switch SWsh2 is in the ON state, the analog signal Vout is sampled by the sample switch SWsh2. The voltage sampled by the sample switch SWsh2 is input to the first input terminal Tc11 of the comparator CMP1 through the capacitance element C1. The second reference signal generation circuit 13 outputs a constant voltage as the second reference signal Ramp from the timing at which the resetting by the switch SW1 and the switch SW2 is started to the timing at which the voltage in accordance with the analog signal Vout is input to the first input terminal Tc11 of the comparator CMP1.

When the sample-and-hold period SH1 is completed, the control signal of the sample switch SWsh2 becomes the low level. In this way, the sample switch SWsh2 is turned off. Since the sample switch SWsh2 is turned off, the voltage in accordance with the analog signal Vout is held in the capacitance element Csh2. The voltage held in the capacitance element Csh2 is input to the first input terminal Tc11 of the comparator CMP1 through the capacitance element C1.

After the sample-and-hold period SH1 is completed, the AD conversion period AD1 is started. In the AD conversion period AD1, the second reference signal generation circuit 13 decreases the voltage of the second reference signal Ramp. At the same time, the comparator CMP1 starts comparing the voltage of the first input terminal Tc11 with the voltage of the second input terminal Tc12 and the counter CNT starts counting. The voltage of the second reference signal Ramp gradually decreases. The comparator CMP1 outputs the signal CO that represents the result of comparison to the counter CNT.

When the AD conversion period AD1 is started, the voltage of the second input terminal Tc12 of the comparator CMP1 is higher than the voltage of the first input terminal Tc11 of the comparator CMP1. When the voltage of the second input terminal Tc12 of the comparator CMP1 becomes lower than the voltage of the first input terminal Tc11 of the comparator CMP1, the signal CO output from the comparator CMP1 is inverted. In other words, the amount relationship between the voltage of the first input terminal Tc11 of the comparator CMP1 and the voltage of the second input terminal Tc12 of the comparator CMP1 changes. At this time, the comparator CMP1 completes comparing the voltage of the first input terminal Tc11 with the voltage of the second input terminal Tc12 and the counter CNT completes counting.

The counter CNT generates digital data in accordance with the difference between the voltage of the analog signal Vout and the voltage of the first reference signal Vref. The digital data generated by the counter CNT are output to the memory MEM. The memory MEM outputs the digital data output from the counter CNT to the subsequent-stage circuit of the imaging device 1.

When a predetermined time passes, the AD conversion period AD1 is completed. After the AD conversion period AD1 is completed, the second AD conversion is performed. The period in which the second AD conversion is performed includes a sample-and-hold period SH2 and an AD conversion period AD2. An operation in the sample-and-hold period SH2 is similar to the operation in the sample-and-hold period SH1. After the sample-and-hold period SH2 is started, the second reference signal generation circuit 13 outputs a predetermined voltage as the second reference signal Ramp. An operation in the AD conversion period AD2 is similar to the operation in the AD conversion period AD1.

After the AD conversion period AD2 is completed, the third AD conversion is performed. The period in which the third AD conversion is performed includes a sample-and-hold period SH3 and an AD conversion period AD3. An operation in the sample-and-hold period SH3 is similar to the operation in the sample-and-hold period SH1. After the sample-and-hold period SH3 is started, the second reference signal generation circuit 13 outputs the predetermined voltage as the second reference signal Ramp. An operation in the AD conversion period AD3 is similar to the operation in the AD conversion period AD1.

After the third AD conversion is completed, the selection pulse φSel_1 changes from the high level to the low level. For this reason, the selection transistor Sel is turned off. In this way, the selection of the pixel 3 of the first row is canceled and the operation in which the pixel signal is read from the pixel 3 of the first row is completed. Following the operation shown in FIG. 8, the imaging device 1 reads the pixel signal from the pixel 3 of the second row. This operation is similar to the operation shown in FIG. 8.

In the above-described operation, the voltages of the first input terminal Tc11 and the second input terminal Tc12 of the comparator CMP1 are reset in a state in which the voltage of the first reference signal Vref is input to the first input terminal Tc11 of the comparator CMP1. The voltage of the first reference signal Vref is higher than the voltage of the analog signal Vout in accordance with the difference signal Vdiff and the first reference signal Vref. When the voltage in accordance with the analog signal Vout and the first reference signal Vref is input to the first input terminal Tc11 of the comparator CMP1, the voltage lower than the voltage that has been reset is input to the first input terminal Tc11 of the comparator CMP1. The voltage of the first input terminal Tc11 of the comparator CMP1 is lower than the voltage of the second input terminal Tc12 of the comparator CMP1. For this reason, after the comparator CMP1 starts comparing the voltage of the first input terminal Tc11 with the voltage of the second input terminal Tc12, it is guaranteed that the signal CO output from the comparator CMP1 is sure to be inverted. In other words, the AD conversion circuit 10 can enhance the accuracy of AD conversion.

In the imaging device 1, the voltage of the first reference signal Vref is higher than the voltage of the difference signal Vdiff. Even when the voltage of the difference signal Vdiff is zero, the digital data in accordance with the difference between the voltage $V_{OUT}$ of the analog signal Vout and the voltage $V_{REF}$ of the first reference signal Vref represented in Expression (2) are not zero. In other words, offset is included in the digital data. For example, a calculator may calculate digital data of offset components by using data of a dummy pixel disposed in the imaging unit 2 and may subtract the digital data of the offset components from the digital data generated by the counter CNT. In this way, the imaging device 1 can suppress the offset components.

As described above, the AD conversion circuit 10 includes the comparator CMP1, the switch SW1, the switch SW2, the counter CNT (measurement circuit), and the first reference signal generation circuit 9 (first signal generation circuit).

The comparator CMP1 includes the first input terminal Tc11 to which the analog signal Vout (first analog signal) and the first reference signal Vref (second analog signal) are input and the second input terminal Tc12 to which the second reference signal Ramp having the voltage that gradually changes is input. The comparator CMP1 compares a first voltage of the first input terminal Tc11 with a second voltage of the second input terminal Tc12. The comparator CMP1 outputs the signal CO that represents the result of comparison. When the amount of the first voltage of the first input terminal Tc11 and the amount of the second voltage of the second input terminal Tc12 satisfy a predetermined condition, the comparator CMP1 completes comparing the first voltage with the second voltage.

The switch SW1 and the switch SW2 are a reset circuit. When the first reference signal Vref is input to the first input terminal Tc11 of the comparator CMP1, the switch SW1 and the switch SW2 reset the voltage of the first input terminal Tc11 and the voltage of the second input terminal Tc12 of the comparator CMP1. The counter CNT measures the length of time from a timing at which the comparator CMP1 starts comparison to a timing at which the comparator CMP1 completes the comparison. The first reference signal generation circuit 9 generates the first reference signal Vref having a third voltage higher than the voltage of the analog signal Vout.

After the voltage of the first input terminal Tc11 and the voltage of the second input terminal Tc12 of the comparator CMP1 are reset, the analog signal Vout is input to the first input terminal Tc11 of the comparator CMP1. After the analog signal Vout is input to the first input terminal Tc11 of the comparator CMP1, the comparator CMP1 starts comparing the first voltage of the first input terminal Tc11 with the second voltage of the second input terminal Tc12. When the third voltage of the first reference signal Vref is higher than the voltage of the analog signal Vout, the voltage of the second reference signal Ramp gradually decreases.

The voltage of the first reference signal Vref that is the reference is higher than the voltage of the analog signal Vout. For this reason, when the comparison by the comparator CMP1 is started, the AD conversion circuit 10 does not need to change the voltage of the second input terminal Tc12 of the comparator CMP1 to a higher voltage. For this reason, the AD conversion circuit 10 can shorten the processing time of AD conversion.

As described above, the imaging device 1 includes the AD conversion circuit 10, the plurality of pixels 3, the column circuit 8, and the output unit 7 (second signal generation circuit). The plurality of pixels 3 are disposed in a matrix shape. The plurality of pixels 3 output the first pixel signal having the signal level and the second pixel signal having the reset level. The column circuit 8 is disposed so as to correspond to one or more columns in the array of the plurality of pixels 3. The column circuit 8 generates the difference signal Vdiff in accordance with the difference between the reset level and the signal level. The output unit 7 generates the analog signal Vout (first analog signal) on the basis of the difference signal Vdiff and the first reference signal Vref (second analog signal).

The imaging device 1 includes the AD conversion circuit 10 that can shorten the processing time of AD conversion. For this reason, the number of AD conversion circuits 10 disposed in the imaging device 1 can be reduced. Consequently, the imaging device 1 can be miniaturized.

The output unit 7 (second signal generation circuit) includes the differential amplifier AMP, the resistance element R1 (first resistance element), and the resistance element R2 (second resistance element). The differential amplifier AMP includes the first input terminal Ta1, the second input terminal Ta2, and the output terminal Ta3. The resistance element R1 includes the first terminal Tr11 and the second terminal Tr12. The resistance element R2 includes the first terminal Tr21 and the second terminal Tr22. The difference signal Vdiff is input to the first input terminal Ta1 of the differential amplifier AMP. The first terminal Tr11 of the resistance element R1 and the first terminal Tr21 of the resistance element R2 are connected to the second input terminal Ta2 of the differential amplifier AMP. The first reference signal Vref (second analog signal) is input to the second terminal Tr12 of the resistance element R1. The second terminal Tr22 of the resistance element R2 is connected to the output terminal Ta3 of the differential amplifier AMP.

The output unit 7 constituted as described above can easily generate the analog signal Vout.

First Modified Example of First Embodiment

In the imaging device 1 according to a first modified example of the first embodiment, the polarity of the transistors of the circuit of the pixel 3, the column circuit 8, the first reference signal generation circuit 9, and the like is changed. In other words, the N-type transistor is changed to the P-type transistor. In addition, the power source voltage VDD is changed to the ground and the ground is changed to the power source voltage VDD. The signal level is greater than or equal to the reset level.

The first reference signal generation circuit 9 (first signal generation circuit) generates the first reference signal Vref (second analog signal) having a third voltage lower than the voltage of the analog signal Vout (first analog signal). When the third voltage of the first reference signal Vref is lower than the voltage of the analog signal Vout, the voltage of the second reference signal Ramp gradually increases. In other words, the second reference signal generation circuit 13 generates the second reference signal Ramp having a voltage that gradually increases.

In terms of points other than the above, the configuration of the imaging device 1 according to the first modified example of the first embodiment is similar to the configuration of the imaging device 1 according to the first embodiment.

Figure 9:
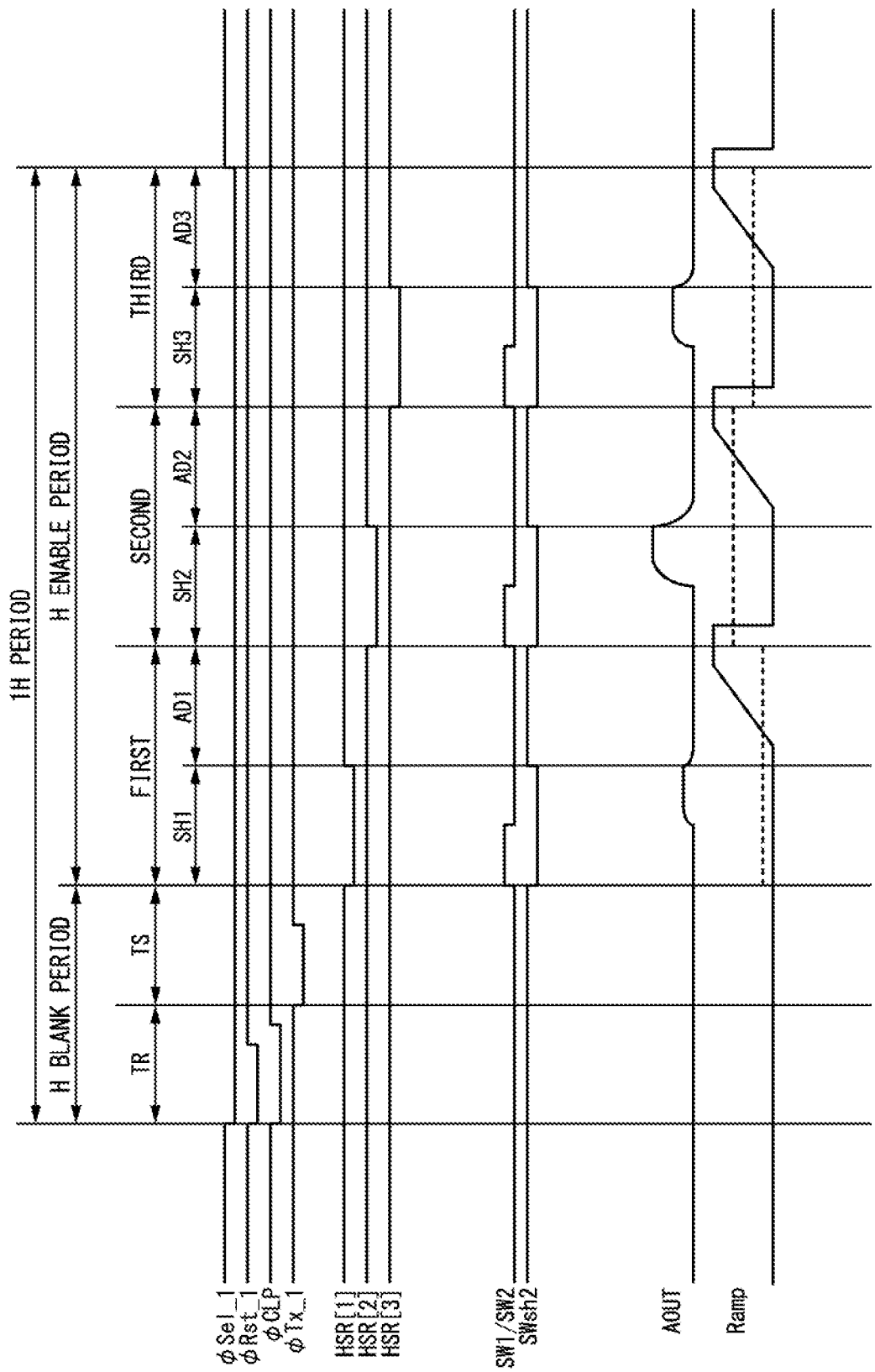
FIG. 9 is a timing chart showing an operation of an imaging device according to a first modified example of the first embodiment of the present invention.

FIG. 9 shows an operation of the imaging device 1. In terms of the operation shown in FIG. 9, points different from the operation shown in FIG. 8 will be described.

In FIG. 9, the state of each control signal is changed. In other words, the low level in FIG. 8 is changed to a high level in FIG. 9 and the high level in FIG. 8 is changed to a low level in FIG. 9.

In the AD conversion period AD1, the second reference signal generation circuit 13 increases the voltage of the second reference signal Ramp. At the same time, the comparator CMP1 starts comparing the first voltage of the first input terminal Tc11 with the second voltage of the second input terminal Tc12 and the counter CNT starts counting. The voltage of the second reference signal Ramp gradually increases. The comparator CMP1 outputs the signal CO that represents the result of comparison to the counter CNT.

When the AD conversion period AD1 is started, the voltage of the second input terminal Tc12 of the comparator CMP1 is lower than the voltage of the first input terminal Tc11 of the comparator CMP1. When the voltage of the second input terminal Tc12 of the comparator CMP1 becomes higher than the voltage of the first input terminal Tc11 of the comparator CMP1, the signal CO output from the comparator CMP1 is inverted. In other words, the amount relationship between the voltage of the first input terminal Tc11 of the comparator CMP1 and the voltage of the second input terminal Tc12 of the comparator CMP1 changes. At this time, the comparator CMP1 completes comparing the voltage of the first input terminal Tc11 with the voltage of the second input terminal Tc12 and the counter CNT completes counting.

In terms of points other than the above, the operation shown in FIG. 9 is similar to the operation shown in FIG. 8.

In the above-described operation, the voltages of the first input terminal Tc11 and the second input terminal Tc12 of the comparator CMP1 are reset in a state in which the voltage of the first reference signal Vref is input to the first input terminal Tc11 of the comparator CMP1. The voltage of the first reference signal Vref is lower than the voltage of the analog signal Vout in accordance with the difference signal Vdiff and the first reference signal Vref. When the voltage in accordance with the analog signal Vout and the first reference signal Vref is input to the first input terminal Tc11 of the comparator CMP1, the voltage higher than the voltage that has been reset is input to the first input terminal Tc11 of the comparator CMP1. The voltage of the first input terminal Tc11 of the comparator CMP1 is higher than the voltage of the second input terminal Tc12 of the comparator CMP1. For this reason, after the comparator CMP1 starts comparing the voltage of the first input terminal Tc11 with the voltage of the second input terminal Tc12, it is guaranteed that the signal CO output from the comparator CMP1 is sure to be inverted. In other words, the AD conversion circuit 10 can enhance the accuracy of AD conversion.

The voltage of the first reference signal Vref that is the reference is lower than the voltage of the analog signal Vout. For this reason, when the comparison by the comparator CMP1 is started, the AD conversion circuit 10 does not need to change the voltage of the second input terminal Tc12 of the comparator CMP1 to a lower voltage. For this reason, the AD conversion circuit 10 can shorten the processing time of AD conversion.

Second Modified Example of First Embodiment

Figure 10:
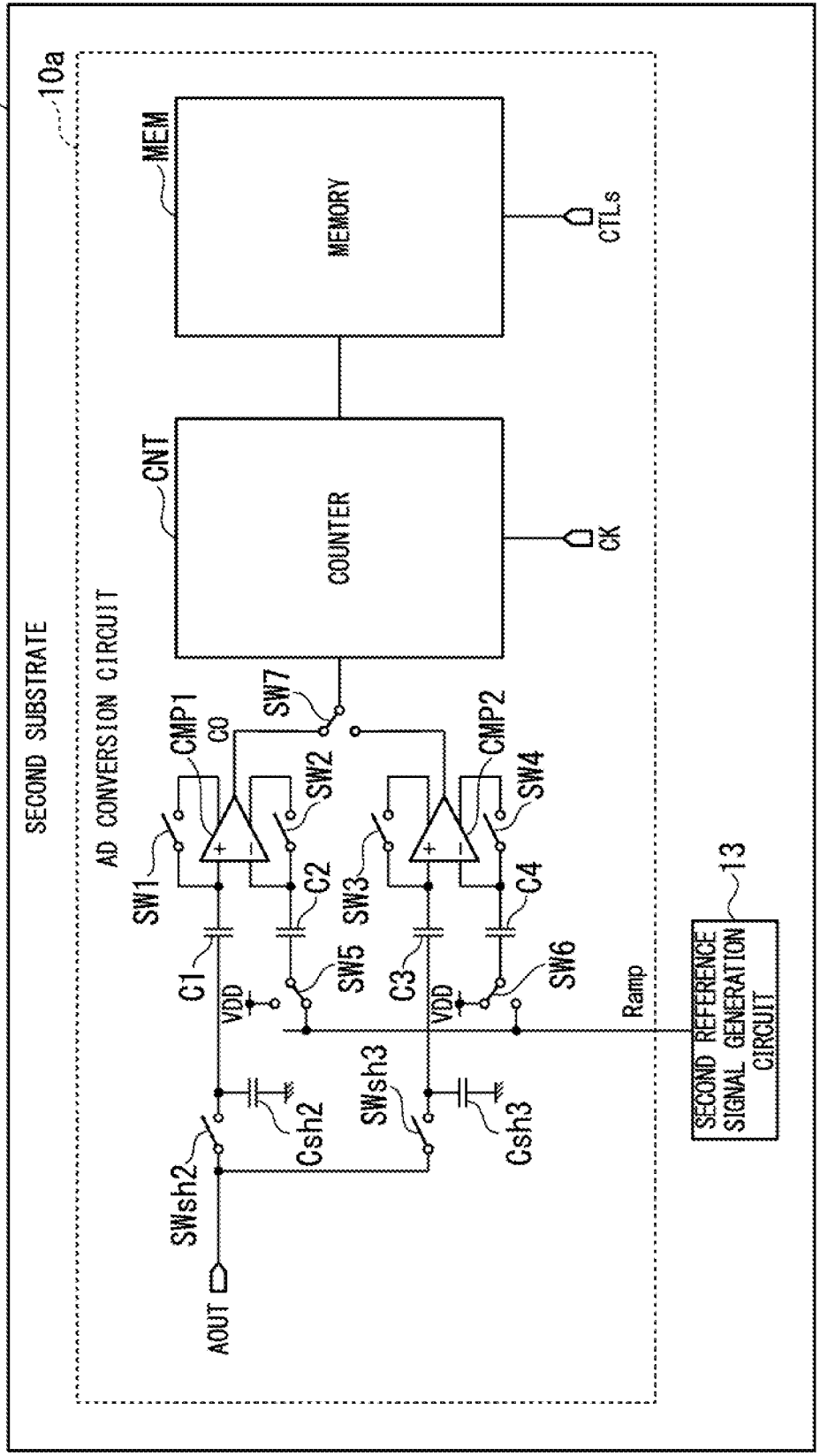
FIG. 10 is a circuit diagram showing a configuration of a second substrate according to a second modified example of the first embodiment of the present invention.

In the imaging device 1 according to a second modified example of the first embodiment, the second substrate 12 shown in FIG. 6 is changed to a second substrate 12a shown in FIG. 10. FIG. 10 shows a configuration of the second substrate 12a. In terms of the configuration shown in FIG. 10, point different from the configuration shown in FIG. 6 will be described.

In the second substrate 12a, the AD conversion circuit 10 shown in FIG. 6 is changed to an AD conversion circuit 10a. The AD conversion circuit 10a includes a sample switch SWsh3, a capacitance element Csh3, a capacitance element C3, a capacitance element C4, a comparator CMP2, a switch SW3, a switch SW4, a switch SW5, a switch SW6, and a switch SW7 in addition to the configuration shown in FIG. 6.

The circuit including the sample switch SWsh3, the capacitance element Csh3, the capacitance element C3, the capacitance element C4, the comparator CMP2, the switch SW3, and the switch SW4 is constituted similarly to the circuit including the sample switch SWsh2, the capacitance element Csh2, the capacitance element C1, the capacitance element C2, the comparator CMP1, the switch SW1, and the switch SW2.

The switch SW5 includes a first terminal, a second terminal, and a third terminal. The power source voltage VDD is input to the first terminal of the switch SW5. The second terminal of the switch SW5 is connected to the second terminal of the capacitance element Cramp of the second reference signal generation circuit 13. The third terminal of the switch SW5 is connected to the first terminal of the capacitance element C2.

The switch SW6 includes a first terminal, a second terminal, and a third terminal. The power source voltage VDD is input to the first terminal of the switch SW6. The second terminal of the switch SW6 is connected to the second terminal of the capacitance element Cramp of the second reference signal generation circuit 13. The third terminal of the switch SW6 is connected to the first terminal of the capacitance element C4.

The switch SW7 includes a first terminal, a second terminal, and a third terminal. The first terminal of the switch SW7 is connected to the output terminal Tc3 of the comparator CMP1. The second terminal of the switch SW7 is connected to the output terminal Tc13 of the comparator CMP2. The third terminal of the switch SW7 is connected to the counter CNT.

The state of the switch SW5 becomes any one of a first state and a second state. When the switch SW5 is in the first state, the first terminal of the switch SW5 and the third terminal of the switch SW5 are electrically connected to each other. At this time, the power source voltage VDD is input to the first terminal of the capacitance element C2. When the switch SW5 is in the second state, the second terminal of the switch SW5 and the third terminal of the switch SW5 are electrically connected to each other. At this time, the second reference signal Ramp generated by the second reference signal generation circuit 13 is input to the first terminal of the capacitance element C2.

The state of the switch SW6 becomes any one of a first state and a second state. When the switch SW6 is in the first state, the first terminal of the switch SW6 and the third terminal of the switch SW6 are electrically connected to each other. At this time, the power source voltage VDD is input to the first terminal of the capacitance element C4. When the switch SW6 is in the second state, the second terminal of the switch SW6 and the third terminal of the switch SW6 are electrically connected to each other. At this time, the second reference signal Ramp generated by the second reference signal generation circuit 13 is input to the first terminal of the capacitance element C4.

The state of the switch SW7 becomes any one of a first state and a second state. When the switch SW7 is in the first state, the first terminal of the switch SW7 and the third terminal of the switch SW7 are electrically connected to each other. At this time, the signal CO output from the comparator CMP1 is input to the counter CNT. When the switch SW7 is in the second state, the second terminal of the switch SW7 and the third terminal of the switch SW7 are electrically connected to each other. At this time, the signal CO output from the comparator CMP2 is input to the counter CNT.

In terms of points other than the above, the configuration shown in FIG. 10 is similar to the configuration shown in FIG. 6.

The AD conversion circuit 10a can perform an interleaving operation. For example, in a period 1, the switch SW5 is set in the second state, the switch SW6 is set in the first state, and the switch SW7 is set in the first state.

In the period 1, the voltage in accordance with the n-th difference signal Vdiff is input to the comparator CMP1. The number n is a natural number. In the period 1, the second reference signal Ramp generated by the second reference signal generation circuit 13 is input to the comparator CMP1. In the period 1, the comparator CMP1 compares the voltages of the two input terminals and outputs the signal CO to the counter CNT. The digital data generated by the counter CNT are output to the subsequent-stage circuit of the imaging device 1.

In the period 1, the first reference signal Vref generated by the first reference signal generation circuit 9 is input to the comparator CMP2. In the period 1, the power source voltage VDD is input to the comparator CMP2 as the second reference signal. In the period 1, the switch SW3 and the switch SW4 reset the voltages of the two input terminals of the comparator CMP2. In addition, in the period 1, the voltage in accordance with the (n+1)-th difference signal Vdiff is held in the capacitance element Csh3.

In a period 2 following the period 1, the switch SW5 is set in the first state, the switch SW6 is set in the second state, and the switch SW7 is set in the second state.

In the period 2, the first reference signal Vref generated by the first reference signal generation circuit 9 is input to the comparator CMP1. In the period 2, the power source voltage VDD is input to the comparator CMP1 as the second reference signal. In the period 2, the switch SW1 and the switch SW2 reset the voltages of the two input terminals of the comparator CMP1. In addition, in the period 2, the voltage in accordance with the (n+2)-th difference signal Vdiff is held in the capacitance element Csh2.

In the period 2, the voltage in accordance with the (n+1)-th difference signal Vdiff is input to the comparator CMP2. In the period 2, the second reference signal Ramp generated by the second reference signal generation circuit 13 is input to the comparator CMP2. In the period 2, the comparator CMP2 compares the voltages of the two input terminals and outputs the signal CO to the counter CNT. The digital data generated by the counter CNT are output to the subsequent-stage circuit of the imaging device 1.

As described above, one of the two comparators compares the voltages of the two input terminals. In the meantime, the voltages of the two input terminals of the other of the two comparators are reset and the voltage in accordance with the difference signal Vdiff is held in the capacitance element on the side of the other of the two comparators.

Figure 11:
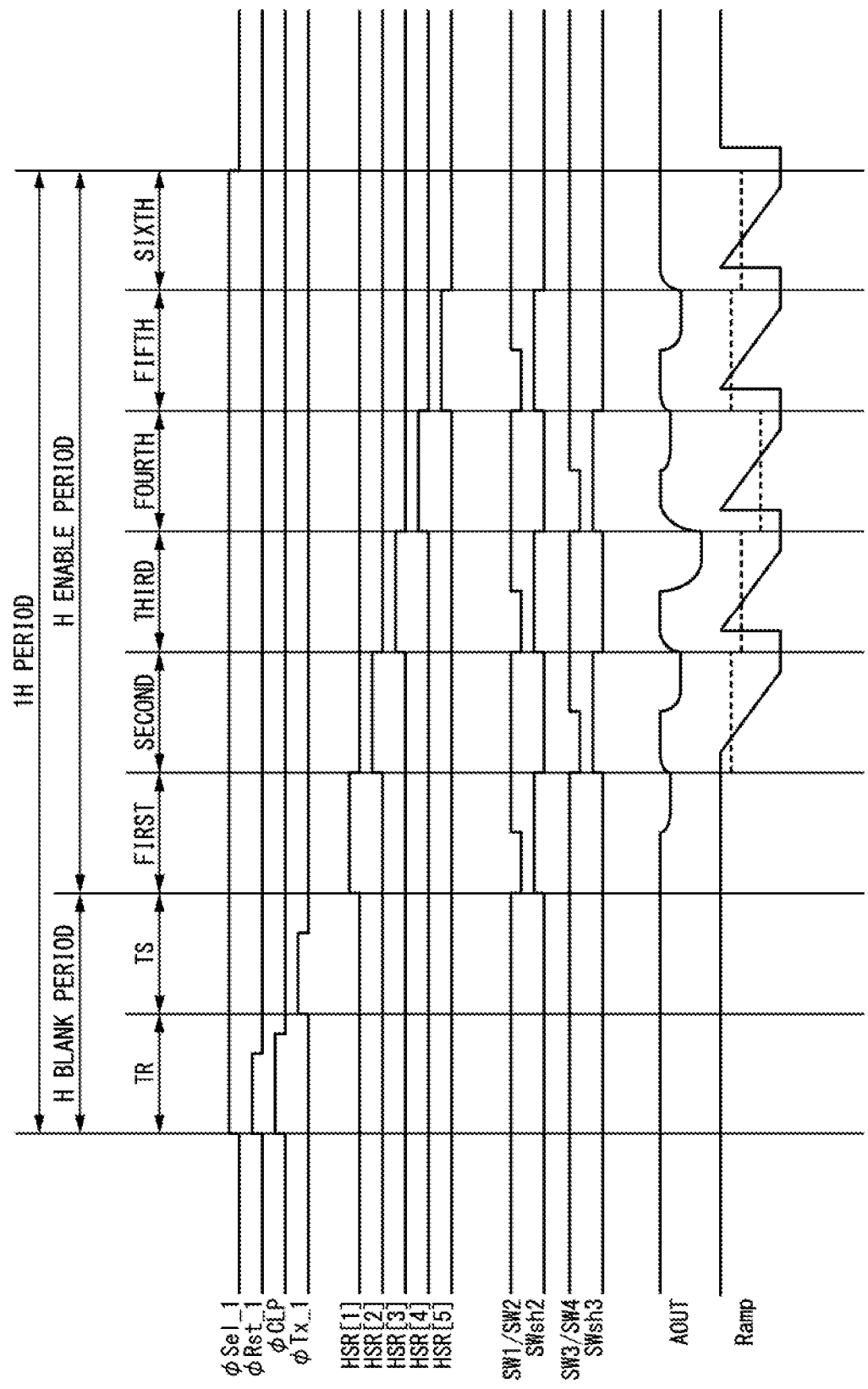
FIG. 11 is a timing chart showing an operation of an imaging device according to the second modified example of the first embodiment of the present invention.

FIG. 11 shows the operation of the imaging device 1. In FIG. 11, waveforms of the selection pulse φSel_1, the reset pulse φRst_1, the clamp pulse φCLP, the transfer pulse φTx_1, the selection pulse HSR[1], the selection pulse HSR[2], the selection pulse HSR[3], selection pulse HSR[4], and the selection pulse HSR[5] are shown. In FIG. 11, a waveform of a control signal of each of the switch SW1, the switch SW2, and the sample switch SWsh2 is shown. In FIG. 11, a waveform of a control signal of each of the switch SW3, the switch SW4, and the sample switch SWsh3 is shown. In FIG. 11, waveforms of the analog signal AOUT and the second reference signal Ramp are shown. The horizontal direction in FIG. 11 represents time and the vertical direction in FIG. 11 represents voltage.

In terms of the operation shown in FIG. 11, points different from the operation shown in FIG. 8 will be described. The operation of the imaging device 1 in a case in which the number of columns of the plurality of pixels 3 of the imaging device 1 is five is shown in FIG. 11.

In FIG. 11, the state of the control signal of each of the switch SW1 and the switch SW2 is changed. In other words, the low level in FIG. 8 is changed to a high level in FIG. 11 and the high level in FIG. 8 is changed to a low level in FIG. 11. The relationship between the state of the control signal and the operation of the switch for the switch SW3 and the switch SW4 is the same as the relationship between the state of the control signal and the operation of the switch for the switch SW1 and the switch SW2.

The H enable period includes a plurality of periods. In a first period, the switch SW5 is set in the first state, the switch SW6 is set in the second state, and the switch SW7 is set in the second state. In the first period, the switch SW1 and the switch SW2 reset the voltages of the two input terminals of the comparator CMP1. In addition, in the first period, the voltage in accordance with the difference signal Vdiff output to the horizontal signal line 21 on the basis of the change of the selection pulse HSR[1] is held in the capacitance element Csh2. In the first period, the sample switch SWsh3, the capacitance element Csh3, the capacitance element C3, the capacitance element C4, the comparator CMP2, the switch SW3, and the switch SW4 are in a state in which the operation is stopped.

In a second period following the first period, the switch SW5 is set in the second state, the switch SW6 is set in the first state, and the switch SW7 is set in the first state. In the second period, the comparator CMP1 compares the voltages of the two input terminals and the digital data generated by the counter CNT are output to the subsequent-stage circuit of the imaging device 1. In the second period, the switch SW3 and the switch SW4 reset the voltages of the two input terminals of the comparator CMP2. In addition, in the second period, the voltage in accordance with the difference signal Vdiff output to the horizontal signal line 21 on the basis of the change of the selection pulse HSR[2] is held in the capacitance element Csh3.

In a third period following the second period, the switch SW5 is set in the first state, the switch SW6 is set in the second state, and the switch SW7 is set in the second state. In the third period, the switch SW1 and the switch SW2 reset the voltages of the two input terminals of the comparator CMP1. In addition, in the third period, the voltage in accordance with the difference signal Vdiff output to the horizontal signal line 21 on the basis of the change of the selection pulse HSR[3] is held in the capacitance element Csh2. In the third period, the comparator CMP2 compares the voltages of the two input terminals and the digital data generated by the counter CNT are output to the subsequent-stage circuit of the imaging device 1.

In a fourth period following the third period, the operation similar to the operation in the second period is performed. In a fifth period following the fourth period, the operation similar to the operation in the third period is performed. In a sixth period following the fifth period, the operation similar to the operation in the second period is performed.

In terms of points other than the above, the operation shown in FIG. 11 is similar to the operation shown in FIG. 8.

As described above, the AD conversion circuit 10a includes two comparators and performs the interleaving operation. For this reason, the AD conversion circuit 10a can greatly shorten the processing time of AD conversion compared to the AD conversion circuit 10 according to the first embodiment.

Third Modified Example of First Embodiment

Figure 12:
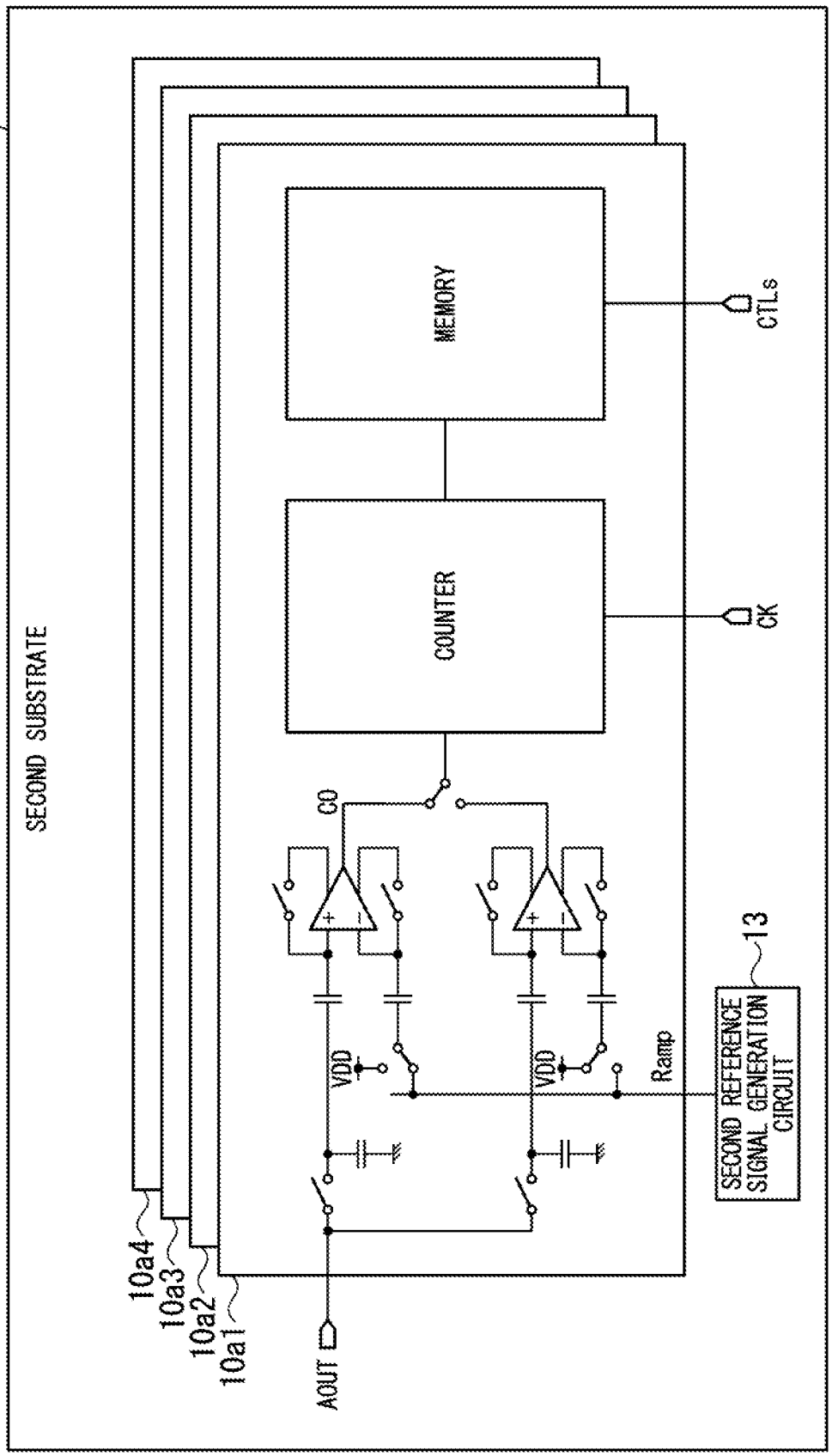
FIG. 12 is a circuit diagram showing a configuration of a second substrate according to a third modified example of the first embodiment of the present invention.

In the imaging device 1 according to a third modified example of the first embodiment, the second substrate 12 shown in FIG. 6 is changed to a second substrate 12b shown in FIG. 12. FIG. 12 shows a configuration of the second substrate 12b. In terms of the configuration shown in FIG. 12, points different from the configuration shown in FIG. 6 will be described.

In the second substrate 12b, the AD conversion circuit 10 shown in FIG. 6 is changed to an AD conversion circuit 10a1, an AD conversion circuit 10a2, an AD conversion circuit 10a3, and an AD conversion circuit 10a4. The AD conversion circuit 10a1, the AD conversion circuit 10a2, the AD conversion circuit 10a3, and the AD conversion circuit 10a4 are constituted similarly to the AD conversion circuit 10a shown in FIG. 10. The second substrate 12b includes AD conversion circuits of four banks connected in parallel with each other. In FIG. 12, the configuration of the AD conversion circuit 10a1 is shown as a representative. Reference numerals of the configuration included in the AD conversion circuit 10a1 are not shown.

In terms of points other than the above, the configuration shown in FIG. 12 is similar to the configuration shown in FIG. 6.

In the second substrate 12b shown in FIG. 12. AD conversion circuits of four banks are disposed. The number of AD conversion circuits disposed in the second substrate 12b has only to be two or more.

The four AD conversion circuits can perform the interleaving operation. For example, in a period 1, the switch SW5 of each bank is set in the second state, the switch SW6 of each bank is set in the first state, and the switch SW7 of each bank is set in the first state.

In the period 1, the voltage in accordance with the n-th difference signal Vdiff is input to the comparator CMP1 of the AD conversion circuit 10a1. The number n is a natural number. In the period 1, the voltage in accordance with the (n+1)-th difference signal Vdiff is input to the comparator CMP1 of the AD conversion circuit 10a2. In the period 1, the voltage in accordance with the (n+2)-th difference signal Vdiff is input to the comparator CMP1 of the AD conversion circuit 10a3. In the period 1, the voltage in accordance with the (n+3)-th difference signal Vdiff is input to the comparator CMP1 of the AD conversion circuit 10a4. In the period 1, the second reference signal Ramp generated by the second reference signal generation circuit 13 is input to the comparator CMP1 of each bank. In the period 1, the comparator CMP1 of each bank compares the voltages of the two input terminals and outputs the signal CO to the counter CNT. The digital data generated by the counter CNT of each bank are output to the subsequent-stage circuit of the imaging device 1.

In the period 1, the first reference signal Vref generated by the first reference signal generation circuit 9 is input to the comparator CMP2 of each bank. In the period 1, the power source voltage VDD is input to the comparator CMP2 of each bank as the second reference signal. In the period 1, the switch SW3 and the switch SW4 reset the voltages of the two input terminals of the comparator CMP2. In addition, in the period 1, the voltage in accordance with the (n+4)-th difference signal Vdiff is held in the capacitance element Csh3 of the AD conversion circuit 10a1. In the period 1, the voltage in accordance with the (n+5)-th difference signal Vdiff is held in the capacitance element Csh3 of the AD conversion circuit 10a2. In the period 1, the voltage in accordance with the (n+6)-th difference signal Vdiff is held in the capacitance element Csh3 of the AD conversion circuit 10a3. In the period 1, the voltage in accordance with the (n+7)-th difference signal Vdiff is held in the capacitance element Csh3 of the AD conversion circuit 10a4.

In a period 2 following the period 1, the switch SW5 of each bank is set in the first state, the switch SW6 of each bank is set in the second state, and the switch SW7 of each bank is set in the second state.

In the period 2, the first reference signal Vref generated by the first reference signal generation circuit 9 is input to the comparator CMP1 of each bank. In the period 2, the power source voltage VDD is input to the comparator CMP1 of each bank as the second reference signal. In the period 2, the switch SW1 and the switch SW2 of each bank reset the voltages of the two input terminals of the comparator CMP1. In addition, in the period 2, the voltage in accordance with the (n+8)-th difference signal Vdiff is held in the capacitance element Csh2 of the AD conversion circuit 10a1, in the period 2, the voltage in accordance with the (n+9)-th difference signal Vdiff is held in the capacitance element Csh2 of the AD conversion circuit 10a2. In the period 2, the voltage in accordance with the (n+10)-th difference signal Vdiff is held in the capacitance element Csh2 of the AD conversion circuit 10a3. In the period 2, the voltage in accordance with the (n+11)-th difference signal Vdiff is held in the capacitance element Csh2 of the AD conversion circuit 10a4.

In the period 2, the voltage in accordance with the (n+4)-th difference signal Vdiff is input to the comparator CMP2 of the AD conversion circuit 10a1. In the period 2, the voltage in accordance with the (n+5)-th difference signal Vdiff is input to the comparator CMP2 of the AD conversion circuit 10a2. In the period 2, the voltage in accordance with the (n+6)-th difference signal Vdiff is input to the comparator CMP2 of the AD conversion circuit 10a3. In the period 2, the voltage in accordance with the (n+7)-th difference signal Vdiff is input to the comparator CMP2 of the AD conversion circuit 104. In the period 2, the comparator CMP2 of each bank compares the voltages of the two input terminals and the digital data generated by the counter CNT of each bank are output to the subsequent-stage circuit of the imaging device 1.

As described above, in each bank, one of the two comparators compares the voltages of the two input terminals. In the meantime, in each bank, the voltages of the two input terminals of the other of the two comparators are reset and the voltage in accordance with the difference signal Vdiff is held in the capacitance element on the side of the other of the two comparators.

Figure 13:
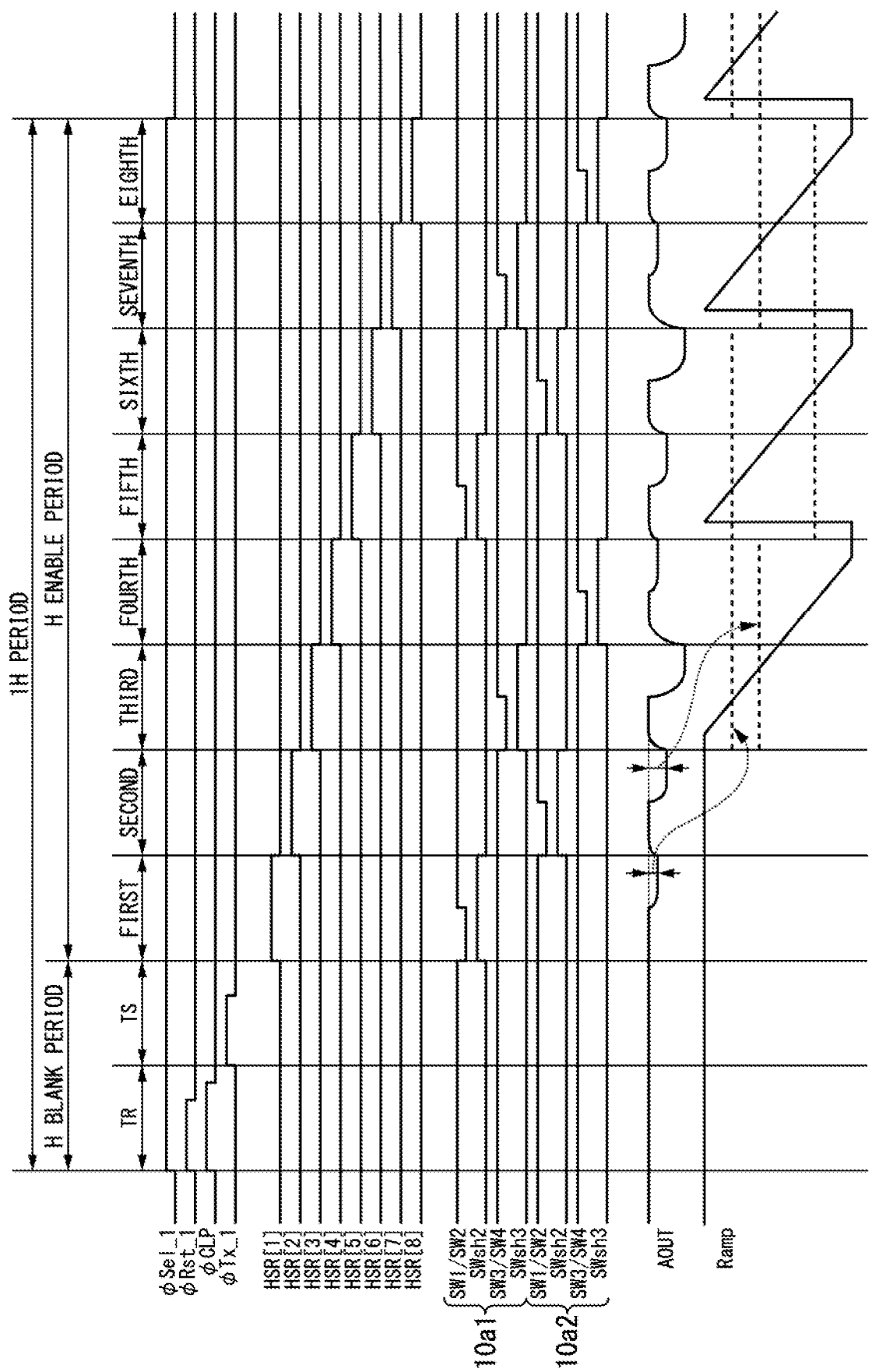
FIG. 13 is a timing chart showing an operation of an imaging device according to the third modified example of the first embodiment of the present invention.

FIG. 13 shows the operation of the imaging device 1 including AD conversion circuits of two banks. For example, the AD conversion circuits of two banks are the AD conversion circuit 10a1 and the AD conversion circuit 102. In FIG. 13, waveforms of the selection pulse φSel_1, the reset pulse φRst_1, the clamp pulse φCLP the transfer pulse φTx_1, the selection pulse HSR[1], the selection pulse HSR[2], the selection pulse HSR[3], selection pulse HSR[4], the selection pulse HSR[5], selection pulse HSR[6], the selection pulse HSR[7], and the selection pulse HSR[8] are shown. In FIG. 13, a waveform of a control signal of each of the switch SW1, the switch SW2, and the sample switch SWsh2 of each bank is shown. In FIG. 13, a waveform of a control signal of each of the switch SW3, the switch SW4, and the sample switch SWsh3 of each bank is shown. In FIG. 13, waveforms of the analog signal AOUT and the second reference signal Ramp are shown. The horizontal direction in FIG. 13 represents time and the vertical direction in FIG. 13 represents voltage.

In terms of the operation shown in FIG. 13, points different from the operation shown in FIG. 8 will be described. The operation of the imaging device 1 in a case in which the number of columns of the plurality of pixels 3 of the imaging device 1 is eight is shown in FIG. 13.

In FIG. 13, the state of the control signal of each of the switch SW1 and the switch SW2 is changed. In other words, the low level in FIG. 8 is changed to a high level in FIG. 13 and the high level in FIG. 8 is changed to a low level in FIG. 13. The relationship between the state of the control signal and the operation of the switch for the switch SW3 and the switch SW4 is the same as the relationship between the state of the control signal and the operation of the switch for the switch SW1 and the switch SW2.

The H enable period includes a plurality of periods. In a first period, the switch SW5 of the AD conversion circuit 10a1 is set in the first state, the switch SW6 of the AD conversion circuit 10a1 is set in the second state, and the switch SW7 of the AD conversion circuit 10a1 is set in the second state. In the first period, the switch SW1 and the switch SW2 of the AD conversion circuit 10a1 reset the voltages of the two input terminals of the comparator CMP1. In addition, in the first period, the voltage in accordance with the difference signal Vdiff output to the horizontal signal line 21 on the basis of the change of the selection pulse HSR[1] is held in the capacitance element Csh2 of the AD conversion circuit 10a1. In the first period, the sample switch SWsh3, the capacitance element Csh3, the capacitance element C3, the capacitance element C4, the comparator CMP2, the switch SW3, and the switch SW4 of the AD conversion circuit 10a1 are in a state in which the operation is stopped. In addition, in the first period, the AD conversion circuit 10a2 is in a state in which the operation is stopped.

In a second period following the first period, the switch SW5 of the AD conversion circuit 102 is set in the first state, the switch SW6 of the AD conversion circuit 10a2 is set in the second state, and the switch SW7 of the AD conversion circuit 10a2 is set in the second state. In the second period, the switch SW1 and the switch SW2 of the AD conversion circuit 10a2 reset the voltages of the two input terminals of the comparator CMP1. In addition, in the second period, the voltage in accordance with the difference signal Vdiff output to the horizontal signal line 21 on the basis of the change of the selection pulse HSR[2] is held in the capacitance element Csh2 of the AD conversion circuit 102. In the second period, the sample switch SWsh3, the capacitance element Csh3, the capacitance element C3, the capacitance element C4, the comparator CMP2, the switch SW3, and the switch SW4 of the AD conversion circuit 10a2 are in a state in which the operation is stopped. In addition, in the second period, the AD conversion circuit 10a1 is in a state in which the operation is stopped.

In a third period following the second period and a fourth period following the third period, the switch SW5 of the AD conversion circuit 10a1 is set in the second state, the switch SW6 of the AD conversion circuit 10a1 is set in the first state, and the switch SW7 of the AD conversion circuit 10a1 is set in the first state. In the third and fourth periods, the switch SW5 of the AD conversion circuit 10a2 is set in the second state, the switch SW6 of the AD conversion circuit 10a2 is set in the first state, and the switch SW7 of the AD conversion circuit 10a2 is set in the first state.

In the third and fourth periods, the comparator CMP1 of the AD conversion circuit 10a1 compares the voltages of the two input terminals and outputs the signal CO to the counter CNT. The digital data generated by the counter CNT of the AD conversion circuit 10a1 are output to the subsequent-stage circuit of the imaging device 1. In the third and fourth periods, the comparator CMP1 of the AD conversion circuit 10a2 compares the voltages of the two input terminals and the digital data generated by the counter CNT of the AD conversion circuit 10a2 are output to the subsequent-stage circuit of the imaging device 1.

In the third period, the switch SW3 and the switch SW4 of the AD conversion circuit 10a1 reset the voltages of the two input terminals of the comparator CMP2. In addition, in the third period, the voltage in accordance with the difference signal Vdiff output to the horizontal signal line 21 on the basis of the change of the selection pulse HSR[3] is held in the capacitance element Csh3 of the AD conversion circuit 10a1.

In the fourth period, the switch SW3 and the switch SW4 of the AD conversion circuit 10a2 reset the voltages of the two input terminals of the comparator CMP2. In addition, in the fourth period, the voltage in accordance with the difference signal Vdiff output to the horizontal signal line 21 on the basis of the change of the selection pulse HSR[4] is held in the capacitance element Csh3 of the AD conversion circuit 10a2.

In a fifth period following the fourth period and a sixth period following the fifth period, the switch SW5 of the AD conversion circuit 10a1 is set in the first state, the switch SW6 of the AD conversion circuit 10a1 is set in the second state, and the switch SW7 of the AD conversion circuit 10a1 is set in the second state. In the fifth and sixth periods, the switch SW5 of the AD conversion circuit 10a2 is set in the first state, the switch SW6 of the AD conversion circuit 10a2 is set in the second state, and the switch SW7 of the AD conversion circuit 10a2 is set in the second state.

In the fifth and sixth periods, the comparator CMP2 of the AD conversion circuit 10a1 compares the voltages of the two input terminals and outputs the signal CO to the counter CNT. The digital data generated by the counter CNT of the AD conversion circuit 10a1 are output to the subsequent-stage circuit of the imaging device 1. In the fifth and sixth periods, the comparator CMP2 of the AD conversion circuit 10a2 compares the voltages of the two input terminals and the digital data generated by the counter CNT of the AD conversion circuit 10a2 are output to the subsequent-stage circuit of the imaging device 1.

In the fifth period, the switch SW1 and the switch SW2 of the AD conversion circuit 10a1 reset the voltages of the two input terminals of the comparator CMP1. In addition, in the fifth period, the voltage in accordance with the difference signal Vdiff output to the horizontal signal line 21 on the basis of the change of the selection pulse HSR[5] is held in the capacitance element Csh2 of the AD conversion circuit 10a1.

In the sixth period, the switch SW1 and the switch SW2 of the AD conversion circuit 10a2 reset the voltages of the two input terminals of the comparator CMP1. In addition, in the sixth period, the voltage in accordance with the difference signal Vdiff output to the horizontal signal line 21 on the basis of the change of the selection pulse HSR[6] is held in the capacitance element Csh2 of the AD conversion circuit 10a2.

In a seventh period following the sixth period, the operation similar to the operation in the third period is performed. In an eighth period following the seventh period, the operation similar to the operation in the fourth period is performed.

In terms of points other than the above, the operation shown in FIG. 13 is similar to the operation shown in FIG. 8.

As described above, the AD conversion circuit 10b includes four comparators and performs the interleaving operation. For this reason, the AD conversion circuit 10b can greatly shorten the processing time of AD conversion compared to the AD conversion circuit 10 according to the first embodiment.

Fourth Modified Example of First Embodiment

Figure 14:
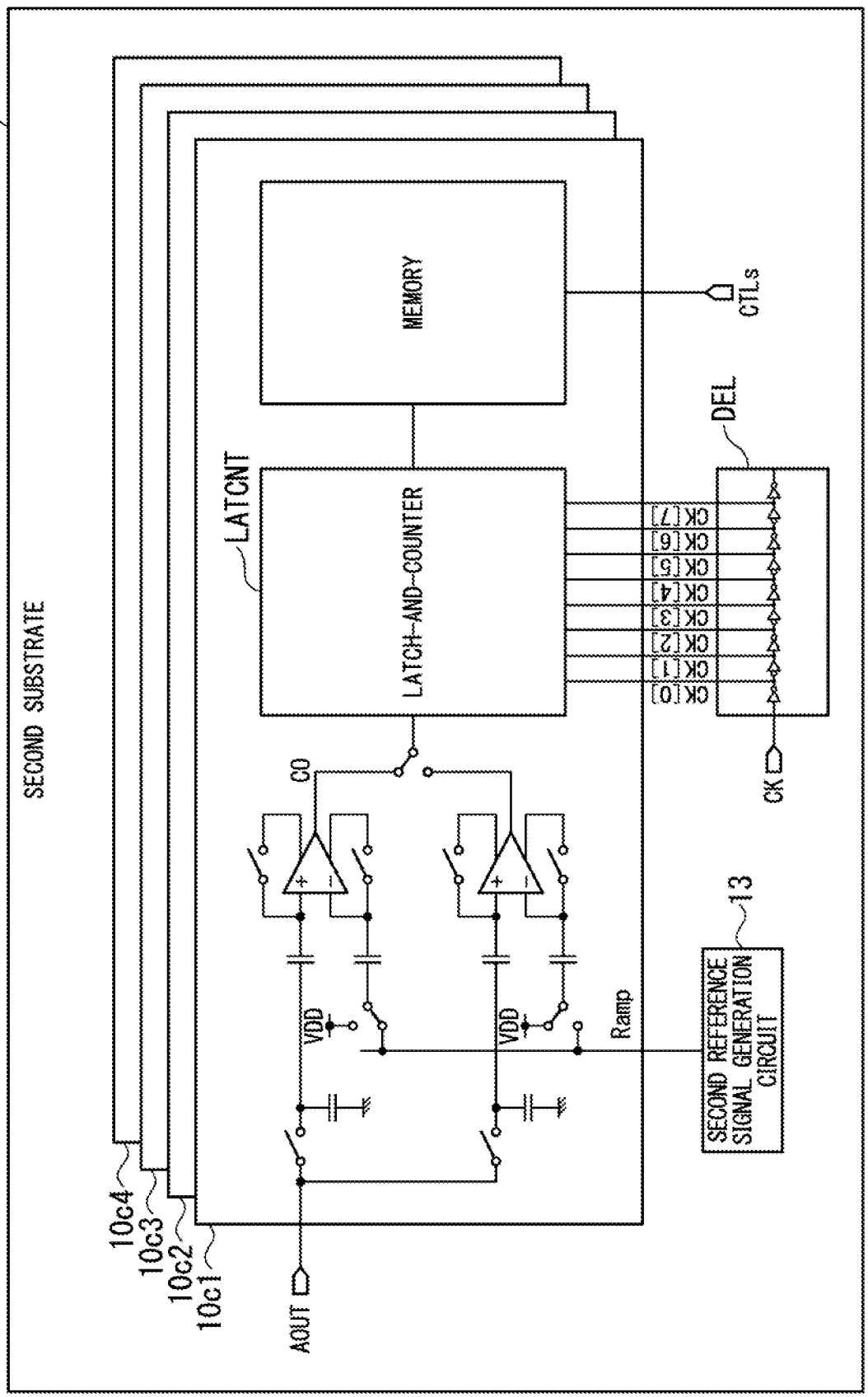
FIG. 14 is a circuit diagram showing a configuration of a second substrate according to a fourth modified example of the first embodiment of the present invention.

In the imaging device 1 according to a fourth modified example of the first embodiment, the second substrate 12b shown in FIG. 12 is changed to a second substrate 12c shown in FIG. 14. FIG. 14 shows a configuration of the second substrate 12c. In terms of the configuration shown in FIG. 14, points different from the configuration shown in FIG. 12 will be described.

In the second substrate 12c, the AD conversion circuit 10a1, the AD conversion circuit 10a2, the AD conversion circuit 10a3, and the AD conversion circuit 10a4 shown in FIG. 12 are changed to an AD conversion circuit 10c1, an AD conversion circuit 10c2, an AD conversion circuit 10c3, and an AD conversion circuit 10c4, respectively. In addition, the second substrate 12c further includes a delay circuit DEL. In the AD conversion circuit 10c1, the counter CNT of the AD conversion circuit 10a1 shown in FIG. 12 is changed to a latch-and-counter LATCNT. The AD conversion circuit 10c2, the AD conversion circuit 10c3, and the AD conversion circuit 10c4 are constituted similarly to the AD conversion circuit 10c1.

The latch-and-counter LATCNT includes a latch circuit corresponding to four lower bits of the digital data and a counter corresponding to six upper bits of the digital data. The delay circuit DEL generates clocks CK[0] to CK[7] of eight phases on the basis of the clock CK. The delay circuit DEL includes a plurality of buffers connected in series with each other. The delay circuit DEL generates the clock CK[0] by inverting and delaying the clock CK by (⅛) π. The delay circuit DEL generates the clock CK[i+1] by inverting and delaying the clock CK[i] by (⅛) π. The number i is an arbitrary integer of zero to six. The clocks CK[0] to CK[7] generated by the delay circuit DEL are output to the latch-and-counter LATCNT. Any one of the clocks CK[0] to CK[7] is used as a count clock by the counter of the latch-and-counter LATCNT.

The counter of the latch-and-counter LATCNT performs an operation similar to the operation of the counter CNT shown in FIG. 6. When the signal CO output from the comparator CMP1 or the comparator CMP2 is inverted, the latch circuit of the latch-and-counter LATCNT holds the state of the clocks CK[0] to CK[7]. The digital data of four bits that are based on the state held in the latch circuit of the latch-and-counter LATCNT are connected to the lower side of the digital data of six bits output from the latch-and-counter LATCNT.

The configuration including the latch-and-counter LATCNT and the delay circuit DEL are disclosed in Japanese Unexamined Patent Application. First Publication No. 2008-092091 that is a reference document. The operation of the latch-and-counter LATCNT and the delay circuit DEL is similar to the operation of the circuit disclosed in the reference document.

The AD conversion circuit 10c2, the AD conversion circuit 10c3, and the AD conversion circuit 10c4 are constituted similarly to the AD conversion circuit 10c1. In terms of points other than the above, the configuration shown in FIG. 14 is similar to the configuration shown in FIG. 12.

One cycle of the clock CK is divided into sixteen periods. The digital data generated on the basis of the state held in the latch circuit of the latch-and-counter LATCNT correspond to anyone of the sixteen periods. The AD conversion circuit 10c1 can detect a timing at which the signal CO is inverted in a period that is one sixteenth of one cycle of the clock CK. For this reason, the AD conversion circuit 10c1 can obtain higher resolution. The clock CK does not need to be a high-speed clock.

Second Embodiment

Figure 15:
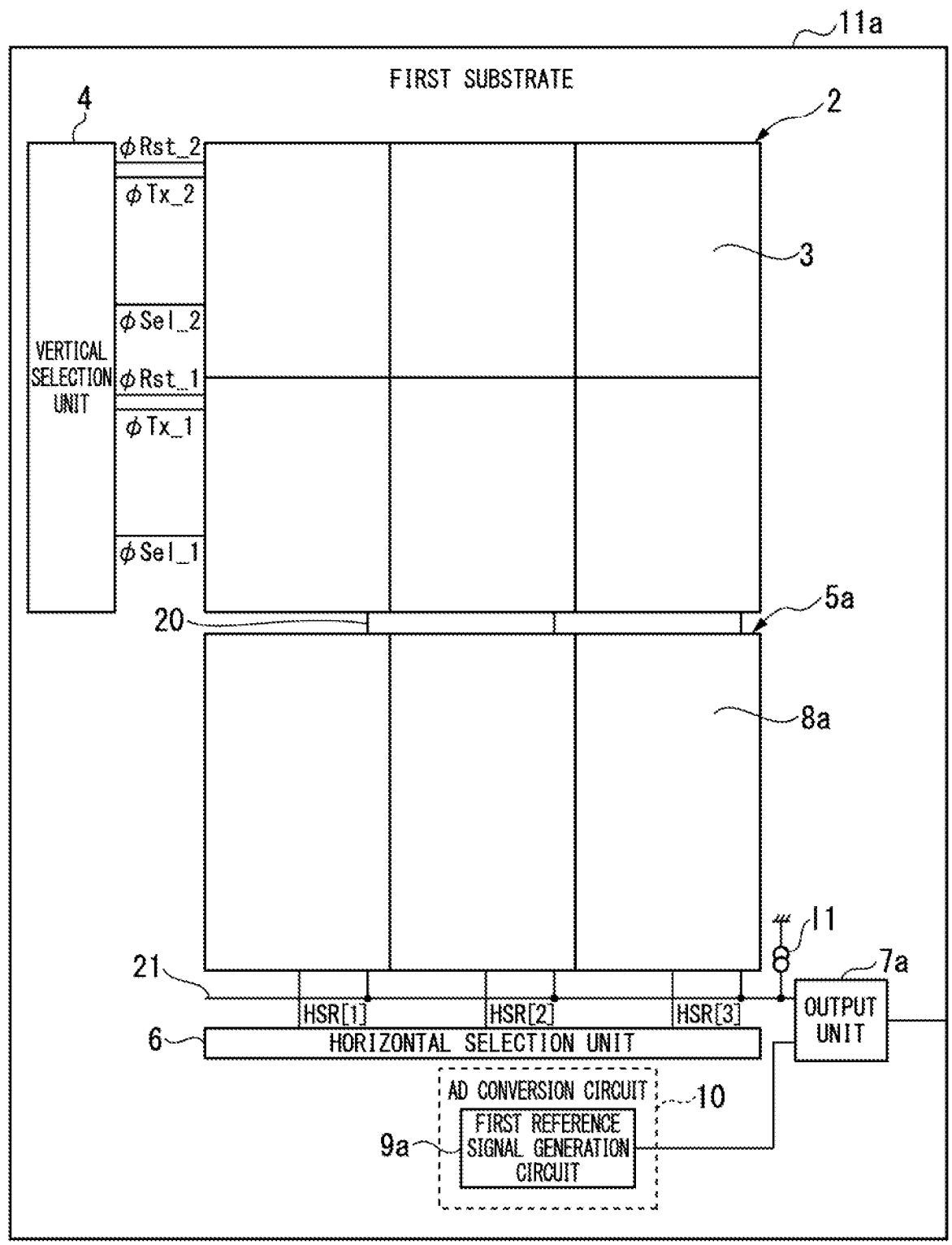
FIG. 15 is a block diagram showing a configuration of a first substrate according to a second embodiment of the present invention.

In the imaging device 1 according to a second embodiment, the first substrate 11 shown in FIG. 2 is changed to a first substrate 11a shown in FIG. 15. FIG. 15 shows a configuration of the first substrate 11a. In terms of the configuration shown in FIG. 15, points different from the configuration shown in FIG. 2 will be described.

In the first substrate 11a, the column circuit unit 5 shown in FIG. 2 is changed to a column circuit unit 5a. In the column circuit unit 5a, the column circuit 8 shown in FIG. 2 is changed to a column circuit 8a. In the first substrate 11a, the output unit 7 shown in FIG. 2 is changed to an output unit 7a. In the first substrate 11a, the first reference signal generation circuit 9 shown in FIG. 2 is changed to a first reference signal generation circuit 9a.

In terms of points other than the above, the configuration shown in FIG. 15 is similar to the configuration shown in FIG. 2.

Figure 16:
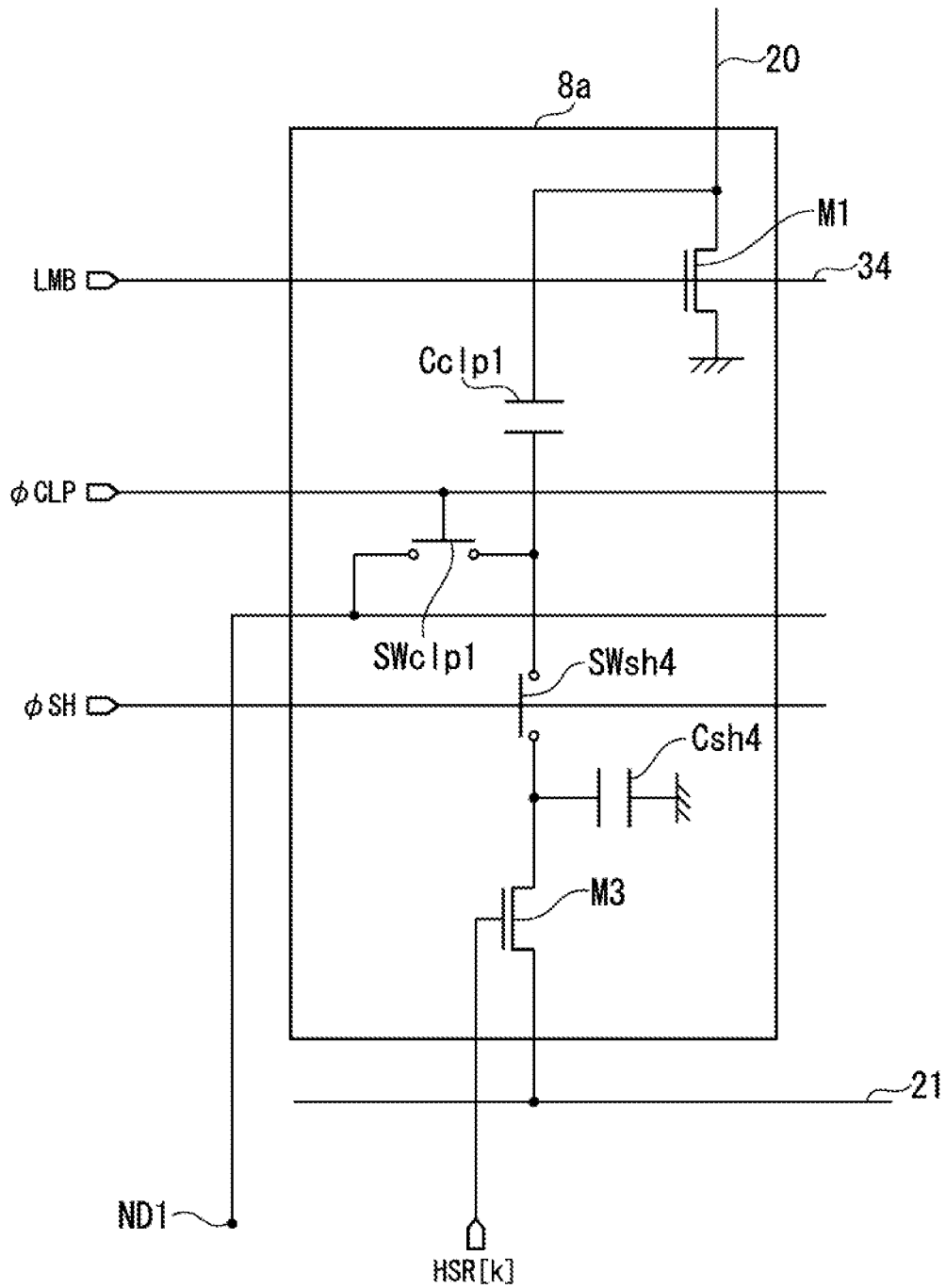
FIG. 16 is a circuit diagram showing a configuration of a column circuit according to the second embodiment of the present invention.

FIG. 16 shows a configuration of the column circuit 8a. In terms of the configuration shown in FIG. 16, points different front the configuration shown in FIG. 4 will be described.

In the column circuit 8a, the amplification transistor M2 shown in FIG. 4 is changed to a sample switch SWsh4 and a capacitance element Csh4. The sample switch SWsh4 includes a first terminal and a second terminal. The first terminal of the sample switch SWsh4 is connected to the second terminal of the capacitance element Cclp1. The second terminal of the sample switch SWsh4 is connected to the capacitance element Csh4.

The capacitance element Csh4 includes a first terminal and a second terminal. The first terminal of the capacitance element Csh4 is connected to the second terminal of the sample switch SWsh4. The second terminal of the capacitance element Csh4 is connected to the ground. The drain terminal of the column selection transistor M3 is connected to the second terminal of the sample switch SWsh4 and the first terminal of the capacitance element Csh4.

The state of the sample switch SWsh4 becomes any one of an ON state and an OFF state. When the sample switch SWsh4 is in the ON state, the sample switch SWsh4 samples the voltage of the second terminal of the capacitance element Cclp1. When the state of the sample switch SWsh4 changes from the ON state to the OFF state, the voltage sampled by the sample switch SWsh4 is held in the capacitance element Csh4. The capacitance element Csh4 holds the voltage in accordance with the difference between the signal level and the reset level output from the pixel 3.

The operation of the sample switch SWsh4 is controlled on the basis of a sample pulse φSH. After the second pixel signal having the reset level is output to the vertical signal line 20, the clamp pulse φCLP changes from the low level to the high level. At this time, the sample pulse φSH changes from the low level to the high level. In this way, the sample switch SWsh4 is turned on. After the clamp pulse φCLP changes from the high level to the low level, the first pixel signal having the signal level is output to the vertical signal line 20. Thereafter, the sample pulse φSH changes from the high level to the low level. In this way, the sample switch SWsh4 is turned off.

The column selection transistor M3 outputs a difference signal that is based on the voltage held in the capacitance element Csh4 to the horizontal signal line 21. The second terminal of the clamp switch SWclp1 is connected to a node ND1.

In terms of points other than the above, the configuration shown in FIG. 16 is similar to the configuration shown in FIG. 4.

Figure 17:
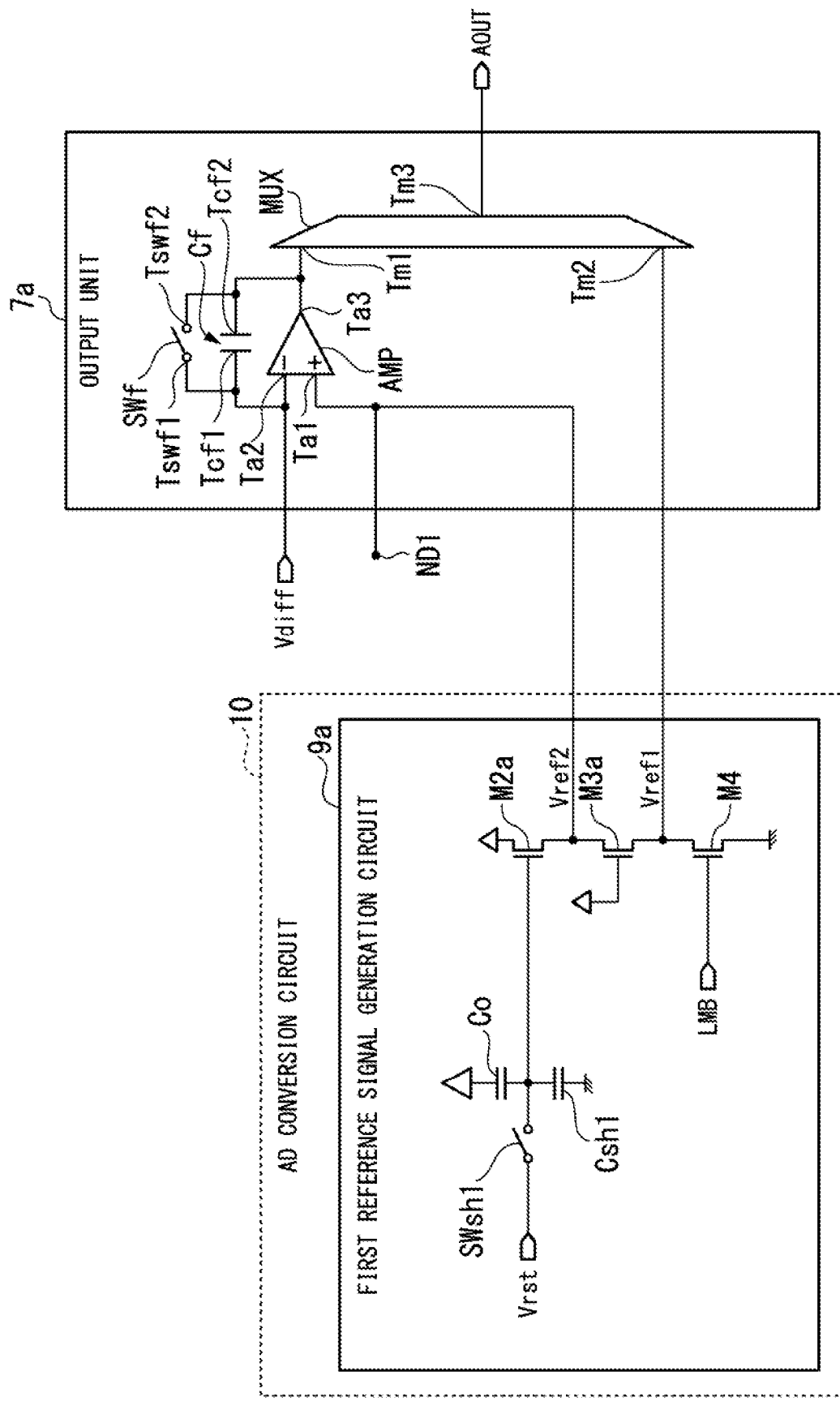
FIG. 17 is a circuit diagram showing a configuration of a first reference signal generation circuit and an output unit according to the second embodiment of the present invention.

FIG. 17 shows a configuration of the first reference signal generation circuit 9a and the output unit 7a. In terms of the configuration shown in FIG. 17, points different from the configuration shown in FIG. 5 will be described.

In the first reference signal generation circuit 9a, the buffer Bf1, the capacitance element Cclp2, and the clamp switch SWclp2 shown in FIG. 5 are not disposed. The first reference signal generation circuit 9a includes a capacitance element Co. The capacitance element Co includes a first terminal and a second terminal. The first terminal of the capacitance element Co is connected to the second terminal of the sample switch SWsh1. The power source voltage VDD is input to the second terminal of the capacitance element Co.

The voltage Vrst is held in the capacitance element Csh1. The gate terminal of the amplification transistor M2a is connected to the second terminal of the sample switch SWsh1 and the first terminal of the capacitance element Csh1. The amplification transistor M2a generates a first reference signal Vref2 by amplifying the voltage of the first terminal of the capacitance element Csh1. In other words, the amplification transistor M2a generates the first reference signal Vref2 on the basis of the voltage of the first terminal of the capacitance element Csh1. The amplification transistor M2a outputs the generated first reference signal Vref2 to the output unit 7a. In addition, the voltage of the source terminal of the selection transistor M3a is output to the output unit 7a as a first reference signal Vref1.

The second current source I2 shown in FIG. 5 is changed to a transistor M4. The transistor M4 is an NMOS transistor. The transistor M4 includes a gate terminal, a source terminal, and a drain terminal. The drain terminal of the transistor M4 is connected to the source terminal of the selection transistor M3a. The source terminal of the transistor M4 is connected to the ground. A predetermined voltage LMB is input to the gate terminal of the transistor M4.

In the output unit 7a, the resistance element R1 and the resistance element R2 shown in FIG. 5 are not disposed. The output unit 7a includes a capacitance element Cf and a switch SWf in addition to the differential amplifier AMP and the selector MUX shown in FIG. 5.

The first input terminal Ta1 of the differential amplifier AMP is connected to the source terminal of the amplification transistor M2a. The first reference signal Vref2 output from the first reference signal generation circuit 9a is input to the first input terminal Ta1 of the differential amplifier AMP. In other words, the first reference signal Vref2 that is based on the first reference signal Vref1 is input to the first input terminal Ta1 of the differential amplifier AMP. The second input terminal Ta2 of the differential amplifier AMP is connected to the horizontal signal line 21. The difference signal Vdiff output from the column circuit 8a is input to the second input terminal Ta2 of the differential amplifier AMP.

The capacitance element Cf includes a first terminal Tcf1 and a second terminal Tcf2. The first terminal Tcf1 of the capacitance element Cf is connected to the second input terminal Ta2 of the differential amplifier AMP. The second terminal Tcf2 of the capacitance element Cf is connected to the output terminal Ta3 of the differential amplifier AMP.

The switch SWf includes a first terminal Tswf1 and a second terminal Tswf2. The first terminal Tswf1 of the switch SWf is connected to the second input terminal Ta2 of the differential amplifier AMP. The second terminal Tswf2 of the switch SWf is connected to the output terminal Ta3 of the differential amplifier AMP. The switch SWf is connected in parallel with the capacitance element Cf between the second input terminal Ta2 of the differential amplifier AMP and the output terminal Ta3 of the differential amplifier AMP.

The state of the switch SWf becomes any one of an ON state and an OFF state. When the switch SWf is in the ON state, the switch SWf resets the voltage of the horizontal signal line 21 and the second input terminal Ta2 of the differential amplifier AMP.

The analog signal Vout output from the differential amplifier AMP is input to the first input terminal Tm1 of the selector MUX. The second input terminal Tm2 of the selector MUX is connected to the source terminal of the selection transistor M3a. The first reference signal Vref1 output from the first reference signal generation circuit 9a is input to the second input terminal Tm2 of the selector MUX. The selector MUX sequentially outputs the analog signal Vout and the first reference signal Vref1 as the analog signal AOUT to the second substrate 12.

The source terminal of the amplification transistor M2a and the first input terminal Ta1 of the differential amplifier AMP are connected to the node ND1. Therefore, the second terminal of the clamp switch SWclp1, the source terminal of the amplification transistor M2a, and the first input terminal Ta1 of the differential amplifier AMP are electrically connected to each other.

The sample switch SWsh1, the capacitance element Csh1, the amplification transistor M2a, and the selection transistor M3a in the first reference signal generation circuit 9a are constituted similarly to the sample switch SWsh4, the capacitance element Csh4, the amplification transistor M2, and the column selection transistor M3, respectively, in the column circuit 8a.

In terms of points other than the above, the configuration shown in FIG. 17 is similar to the configuration shown in FIG. 5.

Before the second pixel signal having the reset level is output to the vertical signal line 20, the sample switch SWsh1 is turned on. Thereafter, the sample switch SWsh1 is turned off. In this way, the voltage Vrst sampled by the sample switch SWsh1 is held in the capacitance element Csh1. The amplification transistor M2a generates the first reference signal Vref2 on the basis of the voltage of the first terminal of the capacitance element Csh1. When the clamp switch SWclp1 of the column circuit 8a is turned on, the second terminal of the capacitance element Cclp1 of the column circuit 8a is clamped to the voltage of the first reference signal Vref2.

After the second pixel signal having the reset level is output to the vertical signal line 20, the first pixel signal having the signal level is output to the vertical signal line 20. The signal level is less than or equal to the reset level. When the first pixel signal having the signal level is output to the vertical signal line 20, the voltage of the source terminal of the column selection transistor M3, i.e., the voltage of the difference signal Vdiff is less than or equal to the voltage of the first reference signal Vref2. The voltage of the source terminal of the amplification transistor M2a, i.e., the voltage of the first reference signal Vref2 is higher than the voltage of the source terminal of the selection transistor M3a, i.e., the voltage of the first reference signal Vref by the voltage $\Delta V_{REF}$ represented in Expression (1) in the first embodiment.

Next, the H enable period is started and the switch SWf is turned on. Thereafter, the switch SWf is turned off. In this way, the voltage of the horizontal signal line 21 and the second input terminal Ta2 of the differential amplifier AMP becomes the same as the voltage of the first reference signal Vref2 input to the first input terminal Ta1 of the differential amplifier AMP. The voltage of the source terminal of the column selection transistor M3 and the voltage of the source terminal of the selection transistor M3a are almost the same. Thereafter, the selection pulse HSR[1] output from the horizontal selection unit 6 to the column circuit 8a of the first column changes from the low level to the high level. For this reason, the column selection transistor M3 is turned on. In this way, the difference signal Vdiff in accordance with the difference between the reset level and the signal level of the pixel 3 in the first row and the first column is output to the horizontal signal line 21. Thereafter, the selection pulse HSR[1] changes from the high level to the low level. For this reason, the column selection transistor M3 is turned off. According to the above-described operation, the difference signal Vdiff in accordance with the difference between the reset level and the signal level of the pixel 3 in the first row and the first column is read.

The differential amplifier AMP and the capacitance element Cf are an inverting amplifier. Following Expression (3) represents the voltage $V_{OUT}$ of the analog signal Vout output from the output terminal Ta3 of the differential amplifier AMP.

$$V_{OUT} = -\frac{C_{SH}}{C_F} \times (V_{DIFF} - V_{REF2}) + V_{REF2} \tag{3}$$

In Expression (3), $C_{SH}$ and $C_F$ are the capacitance value of the capacitance element Csh4 and the capacitance value of the capacitance element Cf, respectively. In Expression (3), $V_{DIFF}$ is the voltage of the difference signal Vdiff. In Expression (3), $V_{REF2}$ is the voltage of the first reference signal Vref2.

The first reference signal Vref1 and the analog signal Vout are sequentially output as the analog signal AOUT from the selector MUX. Digital data in accordance with the difference between the first reference signal Vref1 and the analog signal Vout are generated by the AD conversion circuit 10. Since the voltage $V_{DIFF}$ of the difference signal Vdiff is less than or equal to the voltage $V_{REF2}$ of the first reference signal Vref2, the first term on the right side of Expression (3) is greater than or equal to zero. For this reason, the voltage $V_{OUT}$ of the analog signal Vout is higher than the voltage ($V_{REF2} - \Delta V_{REF}$) of the first reference signal Vref1.

The column circuit 8a may not include the sample switch SWsh4 and the capacitance element Csh4. In a case in which the column circuit 8a does not include the sample switch SWsh4 and the capacitance element Csh4, the column circuit 8a is miniaturized. In a case in which the capacitance element Csh4 is removed, reduction in the gain of the difference signal in the capacitance element Cclp1 and the capacitance element Csh4 is suppressed. For this reason, the S/N ratio of the difference signal increases.

In a case in which the sample switch SWsh4 and the capacitance element Csh4 are removed, the selection transistor Sel of the pixel 3 needs to be maintained in the ON state in an output period of the difference signal. For this reason, when the power source voltage VDD fluctuates, the voltage of the difference signal output from the column circuit 8a changes in accordance with the fluctuation of the power source voltage VDD.

When the power source voltage VDD fluctuates, voltage components caused by the fluctuation of the power source voltage VDD are transmitted to the amplification transistor M2a of the first reference signal generation circuit 9a. When the power source voltage VDD fluctuates, the fluctuation component $\Delta V_{REF2}$ of the first reference signal Vref2 is represented by following Expression (4). In Expression (4), Co is the capacitance value of the capacitance element Co and the $C_{SHR}$ is the capacitance value of the capacitance element Csh1. $\Delta V_{DD}$ is the component in accordance with the fluctuation of the power source voltage VDD.

$$\Delta V_{REF2} = \frac{C_{SHR}}{C_0 + C_{SHR}} \times \Delta V_{DD} \quad (4)$$

When the power source voltage VDD fluctuates, the first reference signal Vref2 generated by the amplification transistor M2a of the first reference signal generation circuit 9a includes the above-described fluctuation component $\Delta V_{REF2}$. On the other hand, when the power source voltage VDD fluctuates, the difference signal Vdiff generated by the amplification transistor M2 of the column circuit 8a includes the component in accordance with the fluctuation of the power source voltage VDD. The analog signal Vout represented in Expression (3) includes the component in accordance with the difference between the difference signal Vdiff and the first reference signal Vref2. In the analog signal Vout represented in Expression (3), the component in accordance with the fluctuation of the power source voltage VDD is reduced. Even in the digital data in accordance with the difference between the first reference signal Vref1 and the analog signal Vout, the component in accordance with the fluctuation of the power source voltage VDD is reduced.

The capacitance element Co of the first reference signal generation circuit 9a corresponds to first parasitic capacitance between the charge storage portion FD of the pixel 3 and the power source. The capacitance element Csh1 of the first reference signal generation circuit 9a corresponds to second parasitic capacitance between the charge storage portion FD of the pixel 3 and the ground. In a case in which the ratio between the capacitance value of the capacitance element Co and the capacitance value of the capacitance element Csh1 is the same as the ratio between the capacitance value of the first parasitic capacitance and the capacitance value of the second parasitic capacitance, the fluctuation component included in the first reference signal Vref1 and the first reference signal Vref2 is almost the same as the fluctuation component included in the difference signal Vdiff. In this case, the fluctuation component in the digital data is almost entirely canceled.

The configuration of the first reference signal generation circuit 9a is not limited to the configuration shown in FIG. 17. In a case in which the sample switch SWsh4 and the capacitance element Csh4 are removed, another configuration that can reduce the component in accordance with the fluctuation of the power source voltage VDD may be applied to the first reference signal generation circuit 9a.

An operation of the imaging device 1 according to the second embodiment is similar to the operation shown in FIG. 9. For this reason, the operation of the imaging device 1 will not be described.

In the imaging device 1 according to the second embodiment, the first reference signal generation circuit 9a (first signal generation circuit) generates the first reference signal Vref1 (second analog signal) having the third voltage lower than the voltage of the analog signal Vout (first analog signal). When the third voltage of the first reference signal Vref1 is lower than the voltage of the analog signal Vout, the voltage of the second reference signal Ramp gradually increases. In other words, the second reference signal generation circuit 13 generates the second reference signal Ramp having the voltage that gradually increases.

The voltages of the first input terminal Tc11 and the second input terminal Tc12 of the comparator CMP1 are reset in a state in which the voltage of the first reference signal Vref1 is input to the first input terminal Tc11 of the comparator CMP1. The voltage of the first reference signal Vref1 is lower than the voltage of the analog signal Vout in accordance with the difference signal Vdiff and the first reference signal Vref2. When the voltage in accordance with the analog signal Vout and the first reference signal Vref1 is input to the first input terminal Tc11 of the comparator CMP1, the voltage higher than the voltage that has been reset is input to the first input terminal Tc11 of the comparator CMP1. The voltage of the first input terminal Tc11 of the comparator CMP1 is higher than the voltage of the second input terminal Tc12 of the comparator CMP1. For this reason, after the comparator CMP1 starts comparing the voltage of the first input terminal Tc11 with the voltage of the second input terminal Tc12, it is guaranteed that the signal CO output from the comparator CMP1 is sure to be inverted. In other words, the AD conversion circuit 10 can enhance the accuracy of AD conversion.

The column circuit 8a includes the capacitance element Csh4 (first capacitance element) that holds the difference signal Vdiff. The output unit 7a (second signal generation circuit) includes the differential amplifier AMP and the capacitance element Cf (second capacitance element). The differential amplifier AMP includes the first input terminal Ta1, the second input terminal Ta2, and the output terminal Ta3. The capacitance element Cf includes the first terminal Tcf1 and the second terminal Tcf2. The difference signal Vdiff is input to the second input terminal Ta2 of the differential amplifier AMP. The first terminal Tcf1 of the capacitance element Cf is connected to the second input terminal Ta2 of the differential amplifier AMP. The second terminal Tcf2 of the capacitance element Cf is connected to the output terminal Ta3 of the differential amplifier AMP. The first reference signal Vref2 that is based on the first reference signal Vref1 (second analog signal) is input to the first input terminal Ta1 of the differential amplifier AMP.

The output unit 7a constituted as described above can easily generate the analog signal Vout.

In the imaging device 1 according to the second embodiment, the polarity of the transistors of the pixel 3, the column circuit 8a, the first reference signal generation circuit 9a, and the like may be changed. In other words, the N-type transistor may be changed to the P-type transistor. In addition, the power source voltage VDD may be changed to the ground and the ground may be changed to the power source voltage VDD. The signal level may be greater than or equal to the reset level.

In the imaging device 1 in which the polarity of the transistors and the polarity of the voltages are changed, the first reference signal generation circuit 9a (first signal generation circuit) generates the first reference signal Vref1 (second analog signal) having the third voltage higher than the voltage of the analog signal Vout (first analog signal). When the third voltage of the first reference signal Vref1 is higher than the voltage of the analog signal Vout, the voltage of the second reference signal Ramp gradually decreases. In other words, the second reference signal generation circuit 13 generates the second reference signal Ramp having the voltage that gradually decreases.

Third Embodiment

Figure 18:
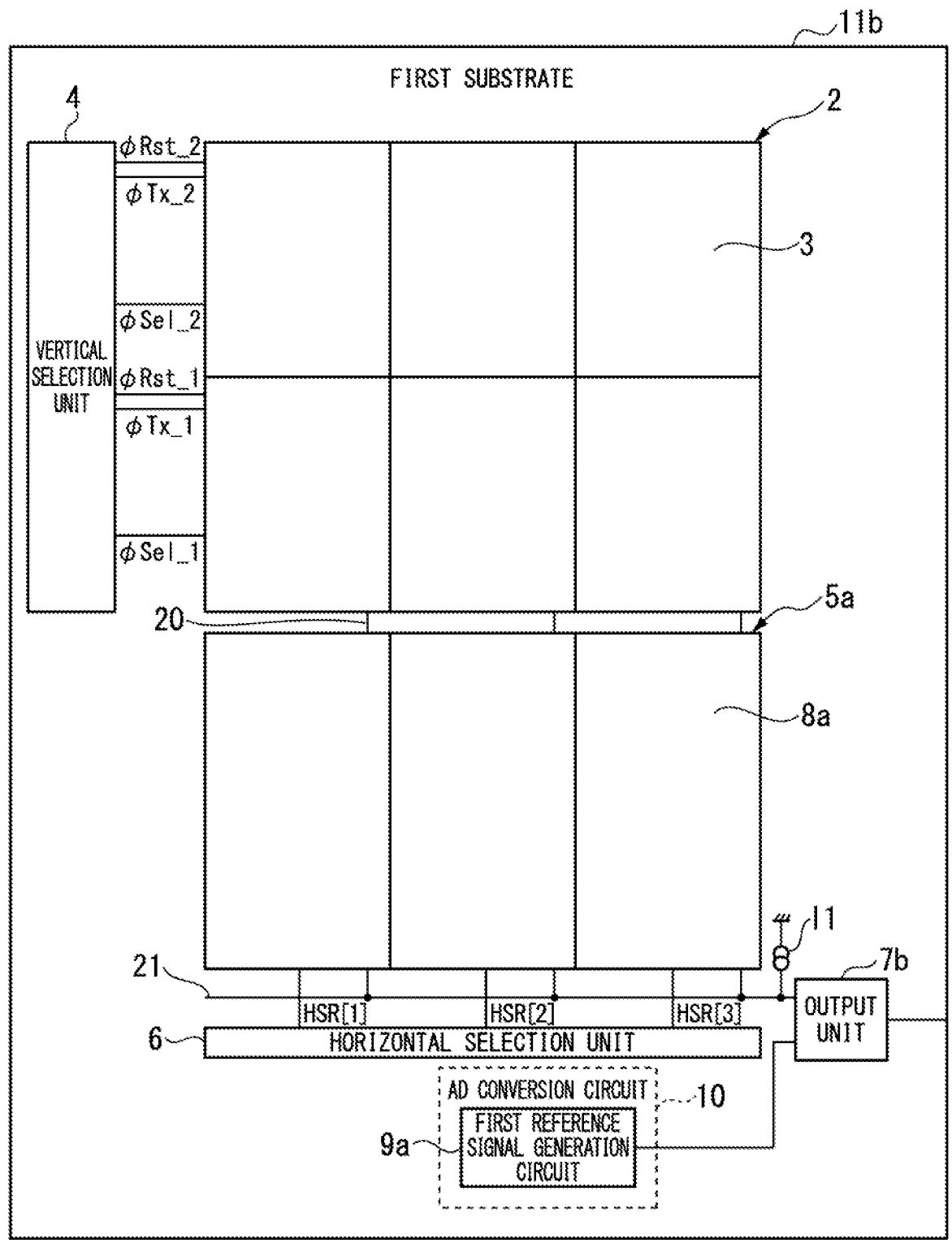
FIG. 18 is a block diagram showing a configuration of a first substrate according to a third embodiment of the present invention.

In the imaging device 1 according to a third embodiment, the first substrate 11a shown in FIG. 15 is changed to a first substrate 11b shown in FIG. 18. FIG. 18 shows a configuration of the first substrate 11b. In terms of the configuration shown in FIG. 18, points different from the configuration shown in FIG. 15 will be described.

In the first substrate 11b, the output unit 7a shown in FIG. 15 is changed to an output unit 7b.

In terms of points other than the above, the configuration shown in FIG. 18 is similar to the configuration shown in FIG. 15.

Figure 19:
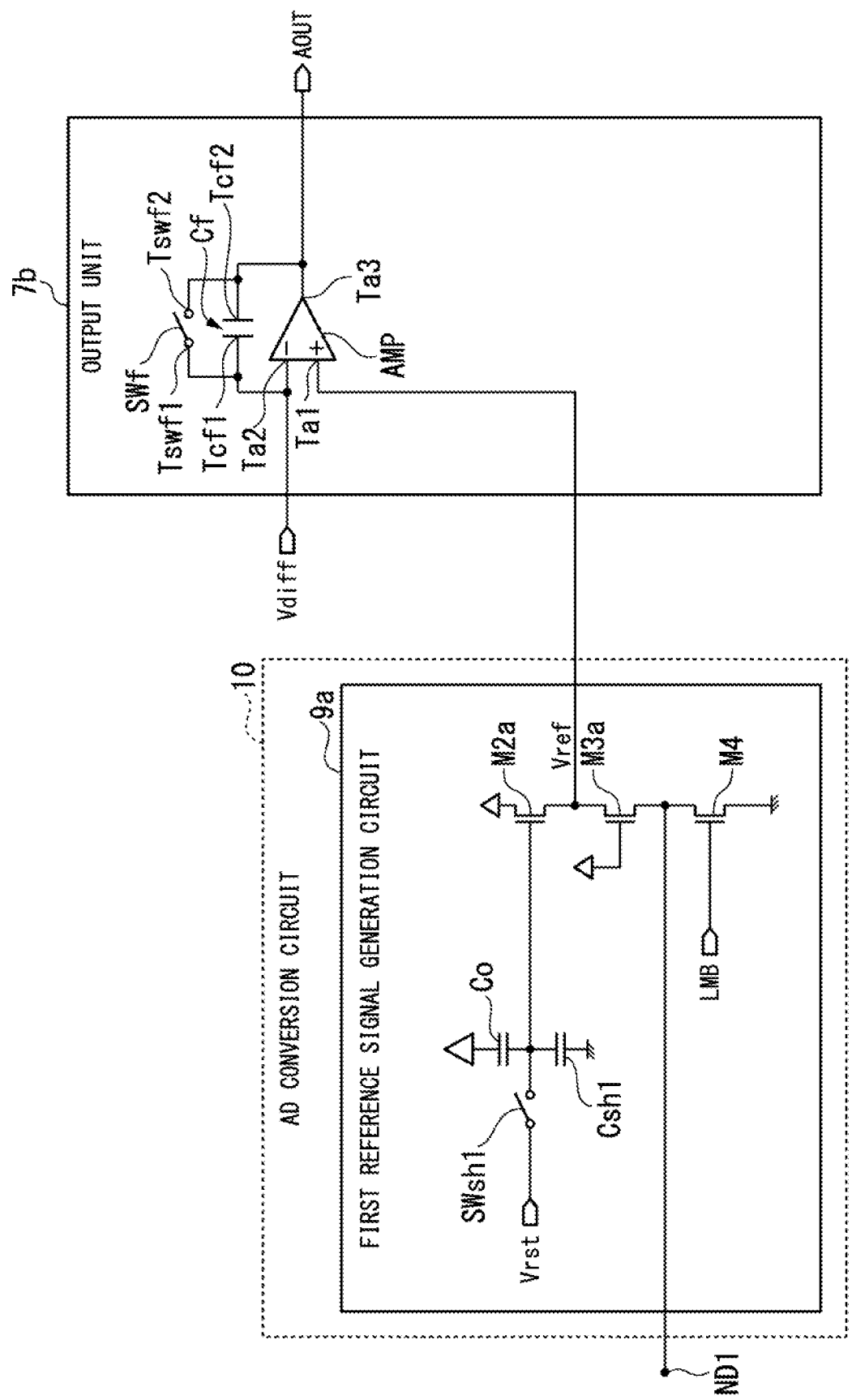
FIG. 19 is a circuit diagram showing a configuration of a first reference signal generation circuit and an output unit according to the third embodiment of the present invention.

FIG. 19 shows a configuration of the first reference signal generation circuit 9a and the output unit 7b. In terms of the configuration shown in FIG. 19, points different from the configuration shown in FIG. 17 will be described.

In the first reference signal generation circuit 9a, the source terminal of the selection transistor M3a is connected to the node ND1. Therefore, the second terminal of the clamp switch SWclp1 and the source terminal of the selection transistor M3a are electrically connected to each other. The amplification transistor M2a generates a first reference signal Vref on the basis of the voltage of the first terminal of the capacitance element Csh1. The amplification transistor M2a outputs the generated first reference signal Vref to the output unit 7b.

In the output unit 7b, the selector MUX shown in FIG. 17 is not disposed. The differential amplifier AMP outputs an analog signal Vout in accordance with the difference between the voltage of the first input terminal Ta1 and the voltage of the second input terminal Ta2 from the output terminal Ta3 to the second substrate 12 as an analog signal AOUT.

In terms of points other than the above, the configuration shown in FIG. 19 is similar to the configuration shown in FIG. 17.

Before the second pixel signal having the reset level is output to the vertical signal line 20, the sample switch SWsh1 is turned on. Thereafter, the sample switch SWsh1 is turned off. In this way, the voltage Vrst sampled by the sample switch SWsh1 is held in the capacitance element Csh1. The amplification transistor M2a generates the first reference signal Vref on the basis of the voltage of the first terminal of the capacitance element Csh1. When the clamp switch SWclp1 of the column circuit 8a is turned on, the second terminal of the capacitance element Cclp1 of the column circuit 8a is clamped to the voltage of the source terminal of the selection transistor M3a.

After the second pixel signal having the reset level is output to the vertical signal line 20, the first pixel signal having the signal level is output to the vertical signal line 20. The signal level is less than or equal to the reset level. The voltage of the source terminal of the amplification transistor M2a, i.e., the voltage of the first reference signal Vref is higher than the voltage of the source terminal of the selection transistor M3a by the voltage $\Delta V_{REF}$ represented in Expression (1) in the first embodiment. When the clamp switch SWclp1 of the column circuit 8a is turned on, the voltage of the second terminal of the capacitance element Cclp1 of the column circuit a is the same as the voltage of the source terminal of the selection transistor M3a. In other words, the voltage of the second terminal of the capacitance element Cclp1 is lower than the voltage of the first reference signal Vref.

Next, the H enable period is started and the switch SWf is turned on. Thereafter, the switch SWf is turned off. In this way, the voltage of the horizontal signal line 21 and the second input terminal Ta2 of the differential amplifier AMP becomes the same as the voltage of the first reference signal Vref input to the first input terminal Ta1 of the differential amplifier AMP. Therefore, the voltage of the source terminal of the column selection transistor M3 is almost the same as the voltage of the first reference signal Vref. The differential amplifier AMP outputs the analog signal AOUT having the voltage of the first reference signal Vref to the second substrate 12. When the analog signal AOUT having the voltage of the first reference signal Vref is input to the first input terminal Tc11 of the comparator CMP1, the switch SW1 and the switch SW2 reset the voltage of the first input terminal Tc11 and the voltage of the second input terminal Tc12 of the comparator CMP1. Thereafter, the selection pulse HSR[1] output from the horizontal selection unit 6 to the column circuit 8a of the first column changes from the low level to the high level. For this reason, the column selection transistor M3 is turned on. In this way, the difference signal Vdiff in accordance with the difference between the reset level and the signal level of the pixel 3 in the first row and the first column is output to the horizontal signal line 21. Thereafter, the selection pulse HSR[1] changes from the high level to the low level. For this reason, the column selection transistor M3 is turned off. According to the above-described operation, the difference signal Vdiff in accordance with the difference between the reset level and the signal level of the pixel 3 in the first row and the first column is read.

When the clamp switch SWclp1 of the column circuit 8a is turned on, the voltage of the second terminal of the capacitance element Cclp1 of the column circuit 8a is lower than the voltage of the first reference signal Vref. The signal level is less than or equal to the reset level. Therefore, when the difference signal Vdiff in accordance with the difference between the reset level and the signal level is output to the horizontal signal line 21, the voltage of the source terminal of the column selection transistor M3, i.e., the voltage of the difference signal Vdiff is lower than the voltage of the first reference signal Vref.

The differential amplifier AMP and the capacitance element Cf are an inverting amplifier. Following Expression (5) represents the voltage $V_{OUT}$ of the analog signal Vout output from the output terminal Ta3 of the differential amplifier AMP.

$$V_{OUT} = -\frac{C_{SH}}{C_F} \times (V_{DIFF} - V_{REF}) + \nabla_{REF} \qquad (5)$$

In Expression (5), $C_{SH}$ and $C_F$ are the capacitance value of the capacitance element Csh4 and the capacitance value of the capacitance element Cf, respectively. In Expression (5), $V_{DIFF}$ is the voltage of the difference signal Vdiff. In Expression (5), $V_{REF}$ is the voltage of the first reference signal Vref.

After the analog signal AOUT having the voltage of the first reference signal Vref is output from the differential amplifier AMP, the analog signal Vout having the voltage represented in Expression (5) is output from the differential amplifier AMP as the analog signal AOUT. Digital data in accordance with the difference between the first reference signal Vref and the analog signal Vout are generated by the AD conversion circuit 10. Since the voltage $V_{DIFF}$ of the difference signal Vdiff is less than the voltage $V_{REF}$ of the first reference signal Vref, the first term on the right side of Expression (5) is greater than zero. For this reason, the voltage $V_{OUT}$ of the analog signal Vout is higher than the voltage $V_{REF}$ of the first reference signal Vref.

The column circuit 8a may not include the sample switch SWsh4 and the capacitance element Csh4. In a case in which the column circuit 8a does not include the sample switch SWsh4 and the capacitance element Csh4, the column circuit 8a is miniaturized. In a case in which the capacitance element Csh4 is removed, reduction in the gain of the difference signal in the capacitance element Cclp1 and the capacitance element Csh4 is suppressed. For this reason, the S/N ratio of the difference signal increases.

As described above, in a case in which the sample switch SWsh4 and the capacitance element Csh4 are removed, the selection transistor Sel of the pixel 3 needs to be maintained in the ON state in the output period of the difference signal Vdiff. When the power source voltage VDD fluctuates, the first reference signal Vref generated by the amplification transistor M2a of the first reference signal generation circuit 9a includes the fluctuation component $\Delta V_{REF2}$ represented in Expression (4). On the other hand, when the power source voltage VDD fluctuates, the voltage of the difference signal Vdiff output from the column circuit 8a includes the component in accordance with the fluctuation of the power source voltage VDD. The analog signal Vout represented in Expression (5) includes the component in accordance with the difference between the difference signal Vdiff and the first reference signal Vref. In the analog signal Vout represented in Expression (5), the component in accordance with the fluctuation of the power source voltage VDD is reduced. Even in the digital data in accordance with the difference between the first reference signal Vref and the analog signal Vout, the component in accordance with the fluctuation of the power source voltage VDD is reduced.

In a case in which the ratio between the capacitance value of the capacitance element Co and the capacitance value of the capacitance element Csh1 is the same as the ratio between the capacitance value of the first parasitic capacitance and the capacitance value of the second parasitic capacitance, the fluctuation component included in the first reference signal Vref is almost the same as the fluctuation component included in the difference signal Vdiff. In this case, the fluctuation component in the digital data is almost entirely canceled.

The configuration of the first reference signal generation circuit 9a is not limited to the configuration shown in FIG. 19. In a case in which the sample switch SWsh4 and the capacitance element Csh4 are removed, another configuration that can reduce the component in accordance with the fluctuation of the power source voltage VDD may be applied to the first reference signal generation circuit 9a.

An operation of the imaging device 1 according to the third embodiment is similar to the operation shown in FIG. 9. For this reason, the operation of the imaging device 1 will not be described.

In the imaging device 1 according to the third embodiment, the first reference signal generation circuit 9a (first signal generation circuit) generates the first reference signal Vref (second analog signal) having the third voltage lower than the voltage of the analog signal Vout (first analog signal). When the third voltage of the first reference signal Vref is lower than the voltage of the analog signal Vout, the voltage of the second reference signal Ramp gradually increases. In other words, the second reference signal generation circuit 13 generates the second reference signal Ramp having the voltage that gradually increases.

The voltages of the first input terminal Tc11 and the second input terminal Tc12 of the comparator CMP1 are reset in a state in which the voltage of the first reference signal Vref is input to the first input terminal Tc11 of the comparator CMP1. The voltage of the first reference signal Vref is lower than the voltage of the analog signal Vout in accordance with the difference signal Vdiff and the first reference signal Vref. When the voltage in accordance with the analog signal Vout and the first reference signal Vref is input to the first input terminal Tc11 of the comparator CMP1, the voltage higher than the voltage that has been reset is input to the first input terminal Tc11 of the comparator CMP1. The voltage of the first input terminal Tc11 of the comparator CMP1 is higher than the voltage of the second input terminal Tc12 of the comparator CMP1. For this reason, after the comparator CMP1 starts comparing the voltage of the first input terminal Tc11 with the voltage of the second input terminal Tc12, it is guaranteed that the signal CO output from the comparator CMP1 is sure to be inverted. In other words, the AD conversion circuit 10 can enhance the accuracy of AD conversion.

In the imaging device 1 according to the third embodiment, the polarity of the transistors of the pixel 3, the column circuit 8a, the first reference signal generation circuit 9a, and the like may be changed. In other words, the N-type transistor may be changed to the P-type transistor. In addition, the power source voltage VDD may be changed to the ground and the ground may be changed to the power source voltage VDD. The signal level may be greater than or equal to the reset level.

In the imaging device 1 in which the polarity of the transistors and the polarity of the voltages are changed, the first reference signal generation circuit 9a (first signal generation circuit) generates the first reference signal Vref (second analog signal) having the third voltage higher than the voltage of the analog signal Vout (first analog signal). When the third voltage of the first reference signal Vref is higher than the voltage of the analog signal Vout, the voltage of the second reference signal Ramp gradually decreases. In other words, the second reference signal generation circuit 13 generates the second reference signal Ramp having the voltage that gradually decreases.

Fourth Embodiment

Figure 20:
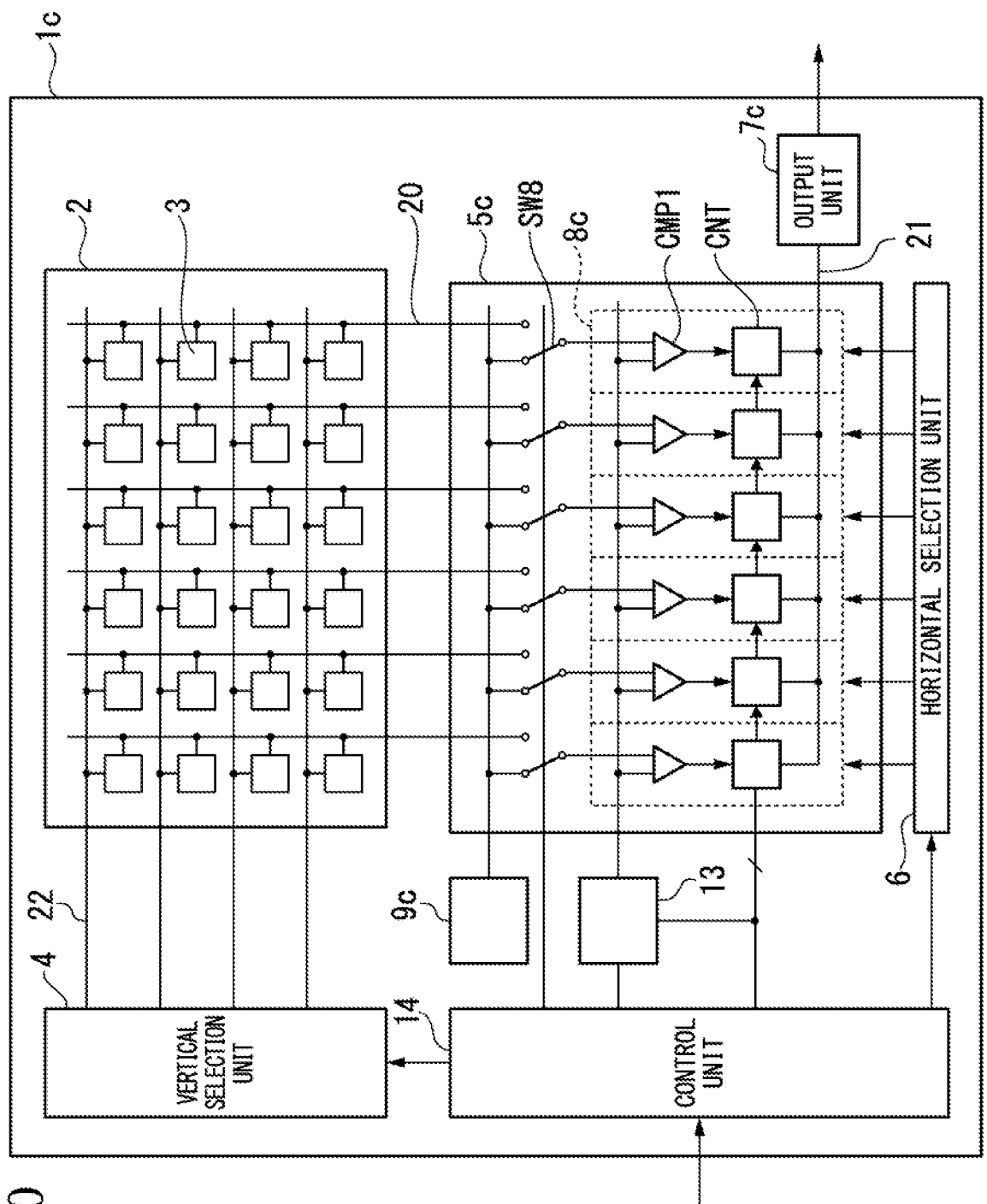
FIG. 20 is a diagram showing a configuration of an imaging device according to a fourth embodiment of the present invention.

FIG. 20 shows a configuration of an imaging device 1c according to a fourth embodiment of the present invention. As shown in FIG. 20, the imaging device 1c includes an imaging unit 2, a vertical selection unit 4, a horizontal selection unit 6, a column circuit unit 5c, an output unit 7c, a first reference signal generation circuit 9c, a second reference signal generation circuit 13, and a control unit 14. For example, the configuration shown in FIG. 20 is disposed on one substrate.

The imaging unit 2 is constituted similarly to the imaging unit 2 shown in FIG. 2 in terms of points other than the array of the pixels 3. The array of the pixels 3 shown in FIG. 20 has four rows and six columns. The vertical selection unit 4 is constituted similarly to the vertical selection unit 4 shown in FIG. 2. The first reference signal generation circuit 9c generates a first reference signal. The second reference signal generation circuit 13 is constituted similarly to the second reference signal generation circuit 13 shown in FIG. 6. The column circuit unit 5c performs AD conversion on a pixel signal output from the imaging unit 2. The horizontal selection unit 6 is constituted similarly to the horizontal selection unit 6 shown in FIG. 2. The horizontal selection unit 6 reads the digital data on which AD conversion has been performed to a horizontal signal line 21. The output unit 7c outputs the digital data read by the horizontal selection unit 6 to a subsequent-stage circuit. The control unit 14 controls each unit.

Hereinafter, each unit will be described in more detail. A row control line 22 is disposed for each row in the array of the plurality of pixels 3. Each row control line 22 is connected to the vertical selection unit 4. A vertical signal line 20 is disposed for each column in the array of the plurality of pixels 3.

The first reference signal generation circuit 9c generates the first reference signal having a voltage that is higher or lower than a reset level. The reset level is known. The first reference signal generation circuit 9c outputs the generated first reference signal to the column circuit unit 5c.

The column circuit unit 5c includes a plurality of column circuits 8c. For example, the plurality of column circuits 8c are disposed for each column in the array of the plurality of pixels 3, in other words, disposed for the vertical signal line 20. The column circuit 8c converts the analog pixel signal into the digital data. One column circuit 8c may be disposed for a plurality of columns in the array of the plurality of pixels 3 and one column circuit 8c may be used in the plurality of columns in a time-division manner. Therefore, the column circuit 8c has only to be disposed so as to correspond to one or more columns in the array of the plurality of pixels 3. The first reference signal generation circuit 9c and the column circuit 8c are an AD conversion circuit.

In addition, the column circuit unit 5c includes a plurality of switches SW8. The switch SW8 is disposed for each column circuit 8c. The switch SW8 switches connection between the vertical signal line 20, the column circuit 8c, and the first reference signal generation circuit 9c. The state of the switch SW8 becomes any one of a first state and a second state. When the switch SW8 is in the first state, the column circuit 8c and the first reference signal generation circuit 9c are electrically connected to each other. At this time, the first reference signal generated by the first reference signal generation circuit 9c is input to the column circuit 8c. When the switch SW8 is in the second state, the column circuit 8c and the vertical signal line 20 are electrically connected to each other. At this time, the pixel signal output from the pixel 3 is input to the column circuit 8c. The operation of the switch SW8 is controlled by the control unit 14.

When the voltage of the first reference signal is higher than the reset level, the second reference signal generation circuit 13 generates the second reference signal having a voltage that gradually decreases. When the voltage of the first reference signal is lower than the reset level, the second reference signal generation circuit 13 generates the second reference signal having a voltage that gradually increases. The second reference signal generation circuit 13 outputs the generated second reference signal to the column circuit unit 5c.

The control unit 14 includes a functional block of a timing generator (TG) and a functional block for communicating with the TG. The TG generates a clock necessary for the operation of the respective units such as the vertical selection unit 4, the first reference signal generation circuit 9c, the second reference signal generation circuit 13, the horizontal selection unit 6, the column circuit unit 5c, and the output unit 7c and generates a pulse signal that represents a predetermined timing.

For example, the output unit 7c has a buffering function. The output unit 7c may have a signal processing function such as black level adjustment, column variation correction, and color processing. Furthermore, the output unit 7c may convert n-bit parallel digital data into serial data and may output the serial data.

A configuration of the column circuit 8c will be described. The column circuit 8c compares the analog pixel signal read from the pixel 3 with the second reference signal output from the second reference signal generation circuit 13. Furthermore, the column circuit 8c generates a pulse signal having a size (pulse width) in the time axis direction corresponding to the amount of the pixel signal. The column circuit 8c performs AD conversion by generating the digital data corresponding to a period of the pulse width of the pulse signal.

The column circuit 8c is disposed for each column in the array of the plurality of pixels 3. In FIG. 20, six column circuits 8c are disposed. The column circuits 8c are the same between the columns. As shown in FIG. 20, the column circuit 8c includes a comparator CMP1 and a counter CNT. The column circuit 8c includes the switch SW1, the switch SW2, and the like shown in FIG. 6, but they are not shown in FIG. 20.

The comparator CMP1 is constituted similarly to the comparator CMP1 shown in FIG. 6. The first reference signal generated by the first reference signal generation circuit 9c or the pixel signal output from the pixel 3 is input to the first input terminal Tc11 of the comparator CMP1 through the switch SW8. The second reference signal generated by the second reference signal generation circuit 13 is input to the second input terminal Tc12 of the comparator CMP1 through the switch SW8.

The comparator CMP1 compares the voltage of the pixel signal with the voltage (ramp voltage) of the second reference signal. In this way, the comparator CMP1 converts the amount of the pixel signal into information (the pulse width of the pulse signal) of the time axis direction. The comparator CMP1 outputs a signal CO that represents the result of comparison. For example, when the ramp voltage is greater than the voltage of the pixel signal, the signal CO becomes a high level. When the ramp voltage is less than or equal to the voltage of the pixel signal, the signal CO becomes a low level.

For example, the counter CNT is constituted by an up-counter or a down-counter. For example, the counter CNT is a counter of ten bits. The bit number of the counter CNT may be a bit number (for example, eight bits) less than ten bits. Alternatively, the bit number of the counter CNT may be a bit number (for example, twelve bits or the like) exceeding ten bits. In addition, the counter CNT is not limited to the up-counter or the down-counter.

The first reference signal generation circuit 9c may be constituted by a power source that generates a predetermined voltage. The first reference signal generation circuit 9c may be constituted similarly to the first reference signal generation circuit 9 shown in FIG. 5 and the column circuit 8c may include a circuit constituted similarly to the output unit 7 shown in FIG. 5. The first reference signal generation circuit 9c may be constituted similarly to the first reference signal generation circuit 9a shown in FIG. 17 and the column circuit 8c may include a circuit constituted similarly to the output unit 7a shown in FIG. 17. The first reference signal generation circuit 9c may be constituted similarly to the first reference signal generation circuit 9a shown in FIG. 19 and the column circuit 8c may include a circuit constituted similarly to the output unit 7b shown in FIG. 19.

An operation of the imaging device 1c will be described. As with the pixel 3 of the first embodiment, the pixel 3 outputs a first pixel signal having a signal level and a second pixel signal having a reset level.

AD conversion is performed as follows. For example, the voltage of the second reference signal that decreases or increases with a predetermined inclination is compared with the voltage of the first pixel signal or the second pixel signal. The counter CNT measures the length of a period from a timing at which the comparison is started to a timing at which the voltage (ramp voltage) of the second reference signal and the voltage of the first pixel signal or the second pixel signal match each other. In this way, the digital data corresponding to the amount of the first pixel signal or the second pixel signal are obtained.

In the following example, the above-described AD conversion is performed on each of the first pixel signal and the second pixel signal read from the pixel 3. Specifically, the second pixel signal having the reset level including noise of the pixel signal is read from the pixel 3 in the selected row through a first reading operation and the AD conversion is performed. Subsequently, the first pixel signal having the signal level is read through a second reading operation and the AD conversion is performed.

(First Reading Operation)

The first reference signal generated by the first reference signal generation circuit 9c is input to the first input terminal Tc11 of the comparator CMP1 through the switch SW8. After the first reference signal is stabilized, the voltages of the first input terminal Tc11 and the second input terminal Tc12 of the comparator CMP1 are reset.

Thereafter, the second pixel signal having the reset level is output from the pixel 3 in an arbitrary row in the array of the plurality of pixels 3 to the vertical signal line 20. The second pixel signal is input to the first input terminal Tc11 of the comparator CMP1 through the switch SW8. Thereafter, the control unit 14 supplies control data for generating the second reference signal to the second reference signal generation circuit 13. The second reference signal generation circuit 13 outputs the second reference signal of which a waveform temporally changes in a ramp shape as a whole. The second reference signal is given to the second input terminal Tc12 of the comparator CMP1. The comparator CMP1 compares the voltage of the second pixel signal with the voltage of the second reference signal. The counter CNT performs counting in a down-count mode by using the clock given by the control unit 14 as a count clock.

When the voltage of the second reference signal given by the second reference signal generation circuit 13 and the voltage of the second pixel signal almost match each other, the comparator CMP1 inverts the signal CO. At this time, the counter CNT holds the count value. In this way, the digital data in accordance with the reset level are obtained. When a predetermined period elapses, the control unit 14 stops supplying the control data to the second reference signal generation circuit 13 and outputting the clock to the counter CNT. In this way, the second reference signal generation circuit 13 stops generating the second reference signal.

(Second Reading Operation)

When the second reading operation is performed, the voltages of the two input terminals of the comparator CMP1 are not reset. The first pixel signal having the signal level is output from the pixel 3 in an arbitrary row in the array of the plurality of pixels 3 to the vertical signal line 20. The first pixel signal is input to the first input terminal Tc11 of the comparator CMP1 through the switch SW8. Thereafter, the control unit 14 supplies control data for generating the second reference signal to the second reference signal generation circuit 13. The second reference signal generation circuit 13 outputs the second reference signal of which a waveform temporally changes in a ramp shape as a whole. The second reference signal is given to the second input terminal Tc12 of the comparator CMP1. The comparator CMP1 compares the voltage of the first pixel signal with the voltage of the second reference signal. The counter CNT performs counting in an up-count mode by using the clock given by the control unit 14 as a count clock.

When the voltage of the second reference signal given by the second reference signal generation circuit 13 and the voltage of the first pixel signal almost match each other, the comparator CMP1 inverts the signal CO. At this time, the counter CNT holds the count value. In this way, the digital data in accordance with the difference between the signal level and the reset level are obtained. When a predetermined period elapses, the control unit 14 stops supplying the control data to the second reference signal generation circuit 13 and outputting the clock to the counter CNT. In this way, the second reference signal generation circuit 13 stops generating the second reference signal.

In the above-described operation, the voltages of the first input terminal Tc11 and the second input terminal Tc12 of the comparator CMP1 are reset in a state in which the voltage of the first reference signal is input to the first input terminal Tc11 of the comparator CMP1. For example, the voltage of the first reference signal is higher than the voltage of the second pixel signal having the reset level. In such a case, the second reference signal generation circuit 13 generates the second reference signal having a voltage that gradually decreases. When the voltage of the second pixel signal is input to the first input terminal Tc11 of the comparator CMP1, the voltage lower than the voltage that has been reset is input to the first input terminal Tc11 of the comparator CMP1. The voltage of the first input terminal Tc11 of the comparator CMP1 is lower than the voltage of the second input terminal Tc12 of the comparator CMP1. For this reason, after the comparator CMP1 starts comparing the voltage of the first input terminal Tc11 with the voltage of the second input terminal Tc12, it is guaranteed that the signal CO output from the comparator CMP1 is sure to be inverted.

Alternatively, the voltage of the first reference signal is lower than the voltage of the second pixel signal having the reset level. In such a case, the second reference signal generation circuit 13 generates the second reference signal having a voltage that gradually increases. When the voltage of the second pixel signal is input to the first input terminal Tc11 of the comparator CMP1, the voltage higher than the voltage that has been reset is input to the first input terminal Tc11 of the comparator CMP1. The voltage of the first input terminal Tc11 of the comparator CMP1 is higher than the voltage of the second input terminal Tc12 of the comparator CMP1. For this reason, after the comparator CMP1 starts comparing the voltage of the first input terminal Tc11 with the voltage of the second input terminal Tc12, it is guaranteed that the signal CO output from the comparator CMP1 is sure to be inverted.

The AD conversion circuit according to the fourth embodiment can shorten the processing time of AD conversion and can enhance the accuracy of AD conversion, as with the AD conversion circuit 10 according to the first embodiment.

As described above, the imaging device 1c includes the AD conversion circuit and the plurality of pixels 3. The plurality of pixels 3 are disposed in a matrix shape. The plurality of pixels 3 output the first pixel signal having the signal level and the second pixel signal having the reset level. The first pixel signal and the second pixel signal are sequentially input to the first input terminal Tc11 of the comparator CMP1 as a first analog signal.

The imaging device 1c includes the AD conversion circuit that can shorten the processing time of AD conversion. For this reason, the number of AD conversion circuits disposed in the imaging device 1c can be reduced. Consequently, the imaging device 1c can be miniaturized.

Fifth Embodiment

Figure 21:
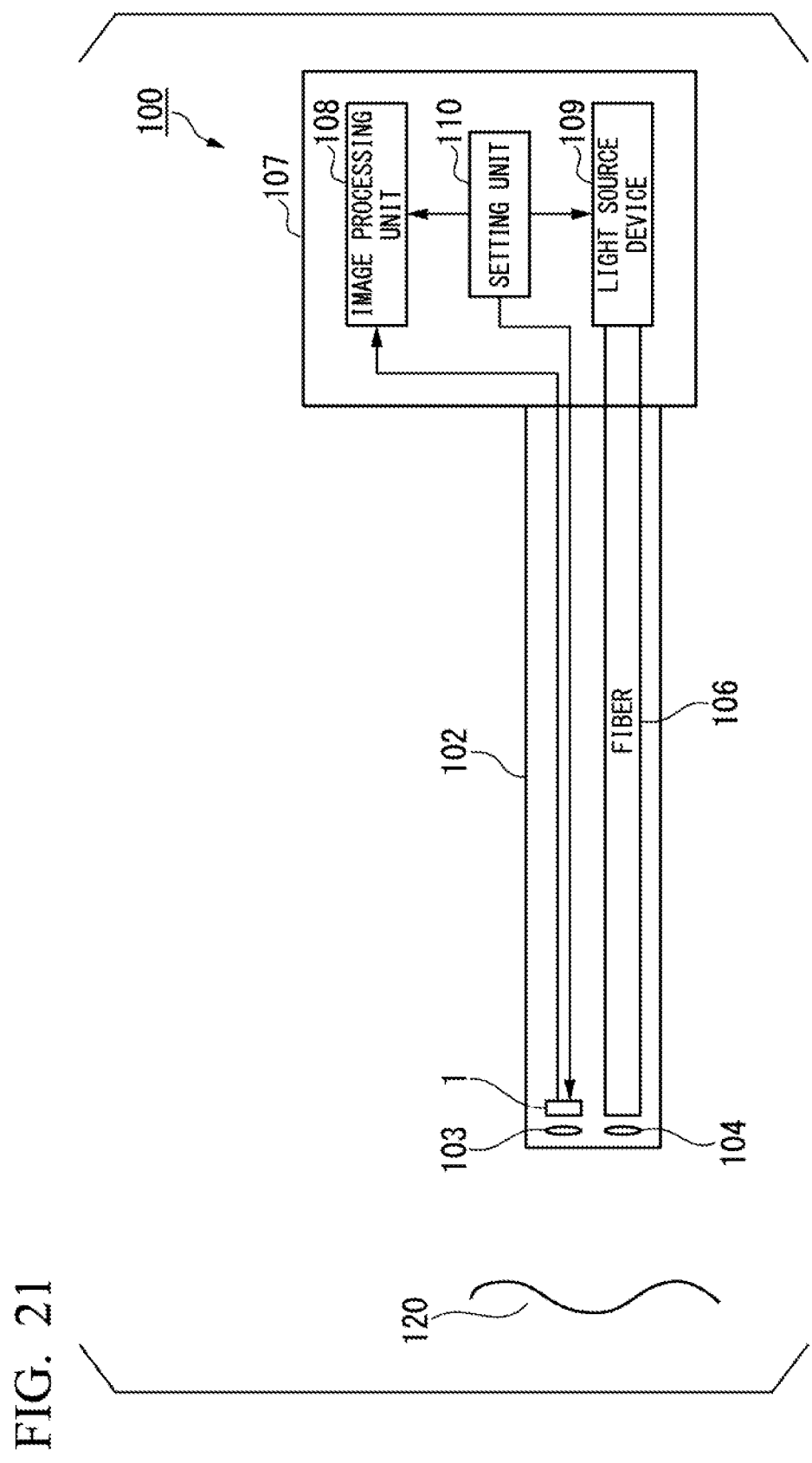
FIG. 21 is a block diagram showing a configuration of an endoscope system according to a fifth embodiment of the present invention.

FIG. 21 shows a configuration of an endoscope system 100 according to a fifth embodiment of the present invention. The endoscope system 100 includes the imaging device 1 according to any one of the first to third embodiments. As shown in FIG. 21, the endoscope system 100 includes a scope 102 and a housing 107. The scope 102 includes the imaging device 1, a lens 103, a lens 104, and a fiber 106. The imaging device 1, the lens 103, and the lens 104 are disposed at the tip end part of the scope 102. The housing 107 includes an image processing unit 108, a light source device 109, and a setting unit 110.

The lens 103 forms an image of reflected light from a subject 120 on the imaging device 1. The fiber 106 transfers illumination light with which the subject 120 is irradiated. The lens 104 irradiates the subject 120 with the illumination light transferred by the fiber 106. The light source device 109 includes a light source that generates the illumination light with which the subject 120 is irradiated. The image processing unit 108 generates a captured image by performing predetermined processing on a signal output from the imaging device 1. The setting unit 110 controls an imaging mode of the endoscope system 100.

The configuration of the endoscope system 100 is not limited to the above-described configuration. The endoscope system according to each aspect of the present invention may not include a configuration corresponding to at least one of the lens 103, the lens 104, the fiber 106, the image processing unit 108, the light source device 109, and the setting unit 110.

Instead of the imaging device 1, the imaging device 1c shown in FIG. 20 may be used.

The endoscope system 100 according to the fifth embodiment includes the imaging device 1 that can shorten the processing time of AD conversion. For this reason, the endoscope system 100 can shorten the processing time of AD conversion.

While preferred embodiments of the invention have been described and shown above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An AD conversion circuit comprising:
a comparator that includes a first input terminal to which a first analog signal and a second analog signal are input and a second input terminal to which a reference signal having a voltage that is configured to gradually change is input and is configured to compare a first voltage of the first input terminal with a second voltage of the second input terminal, to output a signal that represents a result of comparing the first voltage with the second voltage, and to complete comparing the first voltage with the second voltage when an amount of the first voltage and an amount of the second voltage satisfy a predetermined condition;
a reset circuit configured to reset a voltage of the first input terminal of the comparator and a voltage of the second input terminal of the comparator when the second analog signal is input to the first input terminal of the comparator;
a measurement circuit configured to measure a length of time from a timing at which the comparator starts comparing the first voltage with the second voltage to a timing at which the comparator completes comparing the first voltage with the second voltage; and
a first signal generation circuit configured to generate the second analog signal having a third voltage higher or lower than a voltage of the first analog signal,
wherein the first analog signal is input to the first input terminal of the comparator after the voltage of the first input terminal of the comparator and the voltage of the second input terminal of the comparator are reset,
the comparator is configured to start comparing the first voltage with the second voltage after the first analog signal is input to the first input terminal of the comparator,
a voltage of the reference signal gradually decreases when the third voltage of the second analog signal is higher than the voltage of the first analog signal, and
the voltage of the reference signal gradually increases when the third voltage of the second analog signal is lower than the voltage of the first analog signal.

2. An imaging device comprising:
the AD conversion circuit according to claim 1;
a plurality of pixels that are disposed in a matrix shape and are configured to output a first pixel signal having a signal level and a second pixel signal having a reset level;
a column circuit that is disposed so as to correspond to one or more columns in an array of the plurality of pixels and is configured to generate a difference signal in accordance with a difference between the reset level and the signal level; and
a second signal generation circuit configured to generate the first analog signal on the basis of the difference signal and the second analog signal.

3. The imaging device according to claim 2,
wherein the second signal generation circuit includes:
a differential amplifier including a first input terminal, a second input terminal, and an output terminal; and a first resistance element and a second resistance element, each of which includes a first terminal and a second terminal, the difference signal is input to the first input terminal of the differential amplifier, the first terminals of the first resistance element and the second resistance element are connected to the second input terminal of the differential amplifier, the second analog signal is input to the second terminal of the first resistance element, and the second terminal of the second resistance element is connected to the output terminal of the differential amplifier.

4. The imaging device according to claim 2, wherein the column circuit includes a first capacitance element configured to hold the difference signal, the second signal generation circuit includes:
  a differential amplifier including a first input terminal, a second input terminal, and an output terminal; and
  a second capacitance element including a first terminal and a second terminal, the difference signal is input to the second input terminal of the differential amplifier, the first terminal of the second capacitance element is connected to the second input terminal of the differential amplifier, the second terminal of the second capacitance element is connected to the output terminal of the differential amplifier, and a signal that is based on the second analog signal is input to the first input terminal of the differential amplifier.

5. An imaging device comprising:

the AD conversion circuit according to claim 1; and a plurality of pixels that are disposed in a matrix shape and are configured to output a first pixel signal having a signal level and a second pixel signal having a reset level, wherein the first pixel signal and the second pixel signal are sequentially input to the first input terminal of the comparator as the first analog signal.

6. An endoscope system comprising the imaging device according to claim 2.

7. An endoscope system comprising the imaging device according to claim 5.

* * * * *